United States Patent
Lin et al.

(10) Patent No.: US 10,297,518 B2
(45) Date of Patent: May 21, 2019

(54) SEMICONDUCTOR DEVICE AND METHOD OF FORMING SUPPORTING LAYER OVER SEMICONDUCTOR DIE IN THIN FAN-OUT WAFER LEVEL CHIP SCALE PACKAGE

(71) Applicant: STATS ChipPAC Pte. Ltd., Singapore (SG)

(72) Inventors: Yaojian Lin, Singapore (SG); Kang Chen, Singapore (SG); Yu Gu, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 15/167,662

(22) Filed: May 27, 2016

(65) Prior Publication Data

US 2016/0276238 A1 Sep. 22, 2016

Related U.S. Application Data

(63) Continuation of application No. 13/630,912, filed on Sep. 28, 2012, now Pat. No. 9,385,102.

(51) Int. Cl.
*H01L 23/31* (2006.01)
*H01L 23/00* (2006.01)
(Continued)

(52) U.S. Cl.
CPC ...... *H01L 23/3128* (2013.01); *H01L 21/4853* (2013.01); *H01L 21/56* (2013.01);
(Continued)

(58) Field of Classification Search
CPC ..... H01L 21/561; H01L 21/568; H01L 24/19; H01L 24/20
(Continued)

(56) References Cited

U.S. PATENT DOCUMENTS 7,675,182 B2  3/2010 Sun et al.
7,915,076 B2 *  3/2011 Ogawa ............... G02B 6/43
                                              257/678
(Continued)

FOREIGN PATENT DOCUMENTS

CN  1501490 A   6/2004
CN  201038148 Y   3/2008
CN  201417768 Y   3/2010

*Primary Examiner* — David Vu
*Assistant Examiner* — Brandon C Fox
(74) *Attorney, Agent, or Firm* — Robert D. Atkins; Patent Law Group: Atkins and Associates, P.C.

(57) ABSTRACT

A semiconductor device includes a semiconductor die. An encapsulant is formed around the semiconductor die. A build-up interconnect structure is formed over a first surface of the semiconductor die and encapsulant. A first supporting layer is formed over a second surface of the semiconductor die as a supporting substrate or silicon wafer disposed opposite the build-up interconnect structure. A second supporting layer is formed over the first supporting layer and includes a fiber enhanced polymer composite material comprising a footprint including an area greater than or equal to an area of a footprint of the semiconductor die. The semiconductor die comprises a thickness less than 450 micrometers (μm). The thickness of the semiconductor die is at least 1 μm less than a difference between a total thickness of the semiconductor device and a thickness of the build-up interconnect structure and the second supporting layer.

23 Claims, 26 Drawing Sheets

(51) Int. Cl.
*H01L 21/56* (2006.01)
*H01L 23/498* (2006.01)
*H01L 21/48* (2006.01)
*H01L 23/29* (2006.01)

(52) U.S. Cl.
CPC .......... *H01L 21/561* (2013.01); *H01L 23/293* (2013.01); *H01L 23/315* (2013.01); *H01L 23/3114* (2013.01); *H01L 23/3121* (2013.01); *H01L 23/49811* (2013.01); *H01L 23/49833* (2013.01); *H01L 24/19* (2013.01); *H01L 24/96* (2013.01); *H01L 24/97* (2013.01); H01L 21/568 (2013.01); H01L 23/49816 (2013.01); H01L 24/20 (2013.01); H01L 2224/12105 (2013.01); H01L 2224/32225 (2013.01); H01L 2224/73267 (2013.01); H01L 2224/94 (2013.01); H01L 2224/97 (2013.01); H01L 2924/01322 (2013.01); H01L 2924/12041 (2013.01); H01L 2924/12042 (2013.01); H01L 2924/1306 (2013.01); H01L 2924/13091 (2013.01); H01L 2924/15788 (2013.01); H01L 2924/181 (2013.01); H01L 2924/18162 (2013.01); H01L 2924/3511 (2013.01)

(58) Field of Classification Search
USPC .......................................... 257/737; 438/106
See application file for complete search history.

(56) References Cited

U.S. PATENT DOCUMENTS

| | | | |
|---|---|---|---|
| 8,183,677 B2 | 5/2012 | Meyer-Berg | |
| 8,592,992 B2 | 11/2013 | Lin et al. | |
| 8,604,600 B2 | 12/2013 | Scanlan | |
| 8,617,927 B1* | 12/2013 | Margomenos | H01L 23/3677 438/112 |
| 8,810,024 B2 | 8/2014 | Lin et al. | |
| 2004/0113283 A1* | 6/2004 | Farnworth | H01L 21/3043 257/782 |
| 2005/0048759 A1* | 3/2005 | Hsu | H01L 23/36 438/618 |
| 2006/0131746 A1* | 6/2006 | Kohara | H01L 21/561 257/737 |
| 2008/0057333 A1* | 3/2008 | Chu | H05K 1/0373 428/612 |
| 2008/0128885 A1 | 6/2008 | Lee et al. | |
| 2009/0230567 A1* | 9/2009 | Kiong | H01L 21/561 257/783 |
| 2009/0302448 A1* | 12/2009 | Huang | H01L 21/565 257/686 |
| 2009/0302465 A1* | 12/2009 | Huang | H01L 21/568 257/737 |
| 2010/0120204 A1* | 5/2010 | Kunimoto | H01L 21/6835 438/118 |
| 2010/0167471 A1* | 7/2010 | Jin | H01L 21/561 438/127 |
| 2011/0121449 A1 | 5/2011 | Lin et al. | |
| 2011/0278736 A1 | 11/2011 | Lin et al. | |
| 2011/0316150 A1 | 12/2011 | Ozawa | |
| 2012/0074588 A1 | 3/2012 | Hsiao et al. | |
| 2012/0161301 A1 | 6/2012 | Huang et al. | |
| 2012/0217627 A1 | 8/2012 | Tseng et al. | |
| 2012/0238057 A1 | 9/2012 | Hu et al. | |
| 2013/0049205 A1 | 2/2013 | Meyer et al. | |
| 2013/0062760 A1 | 3/2013 | Hung et al. | |

* cited by examiner

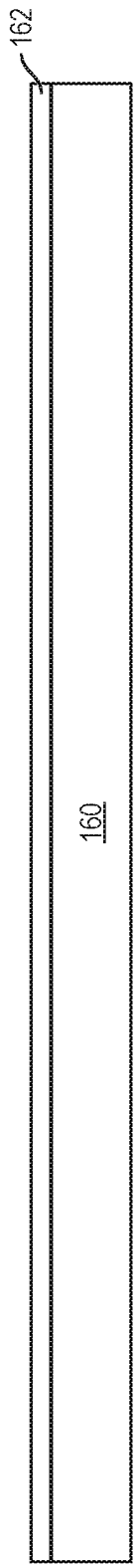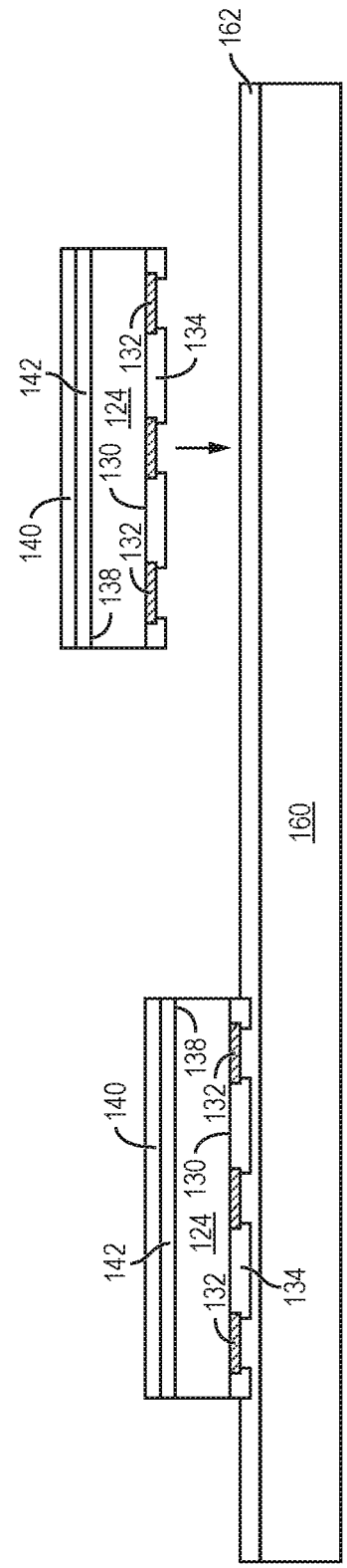
FIG. 4a
FIG. 4b

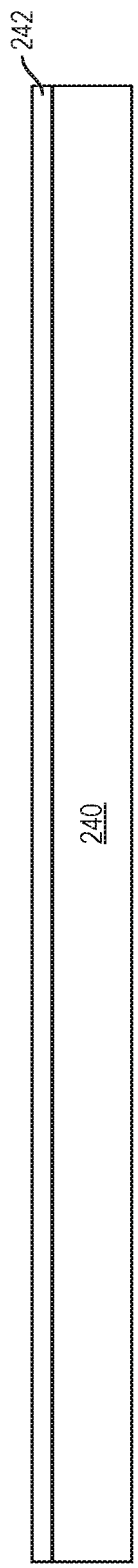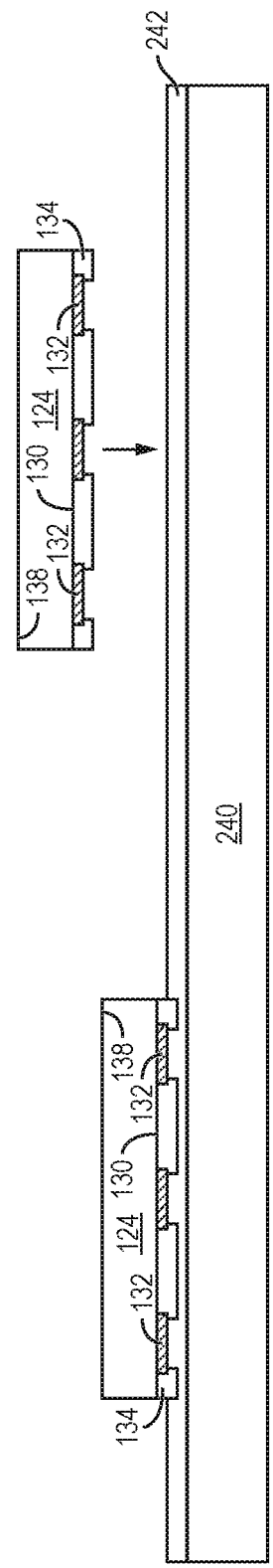

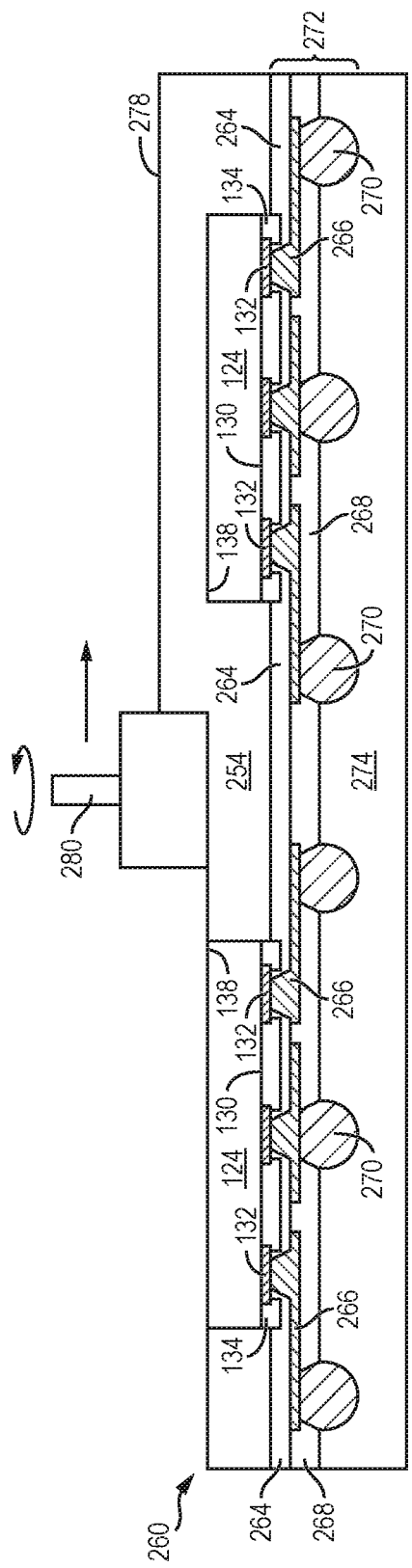
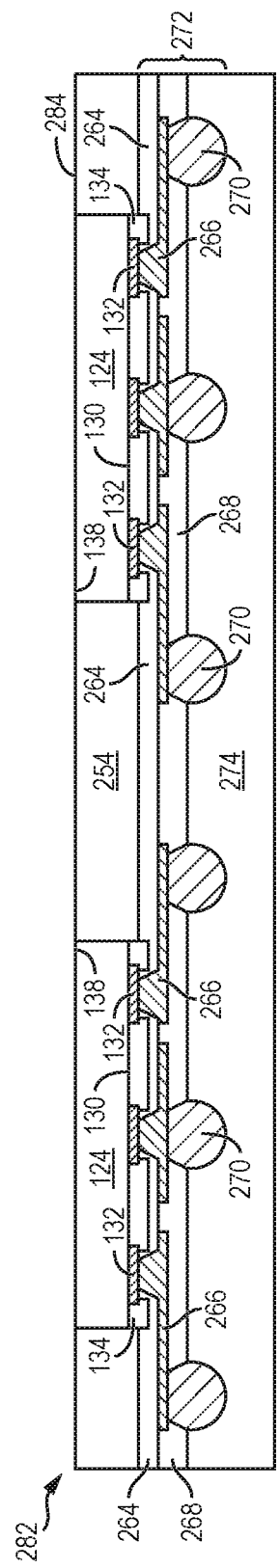
FIG. 7g
FIG. 7h

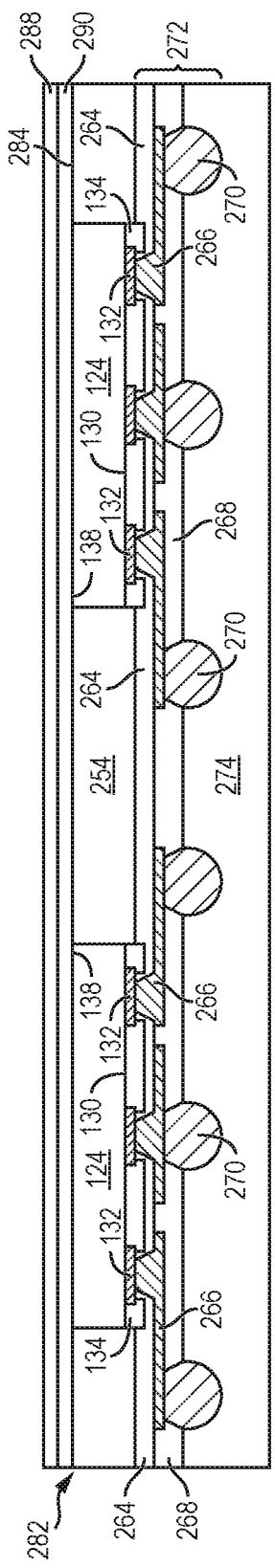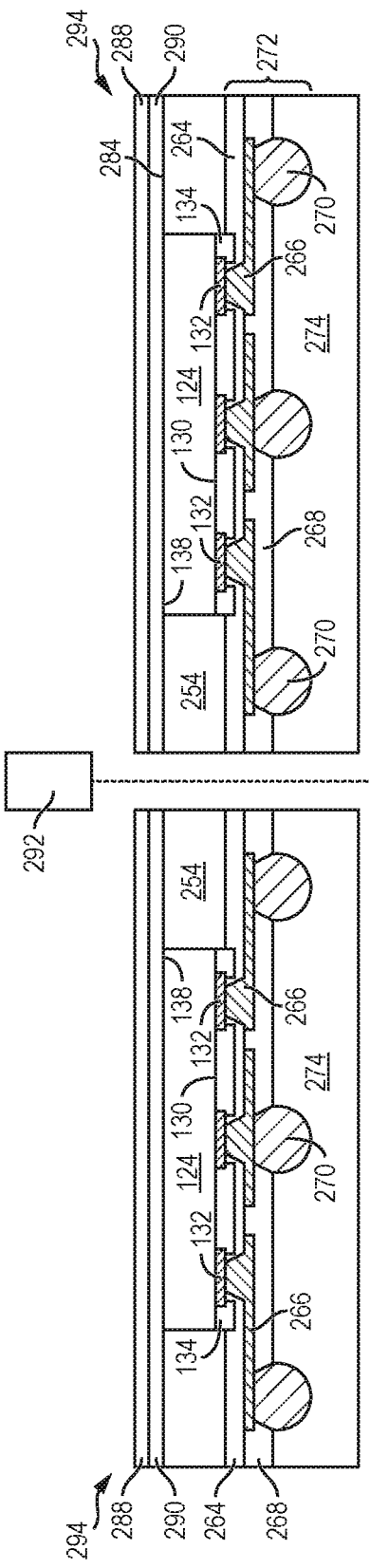

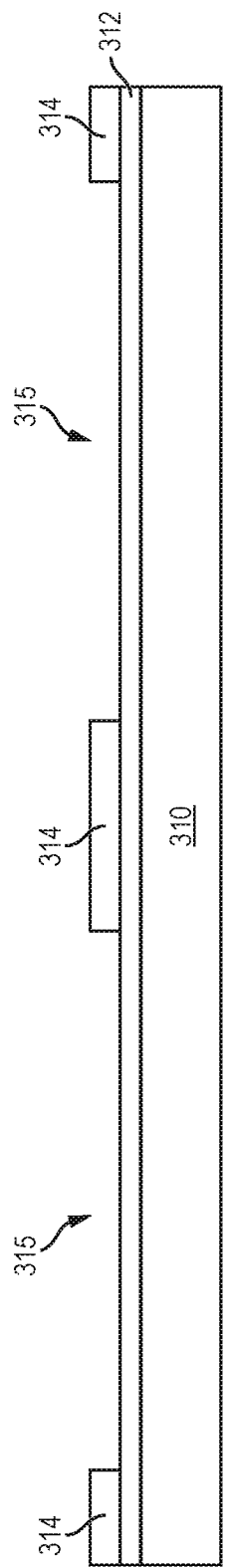
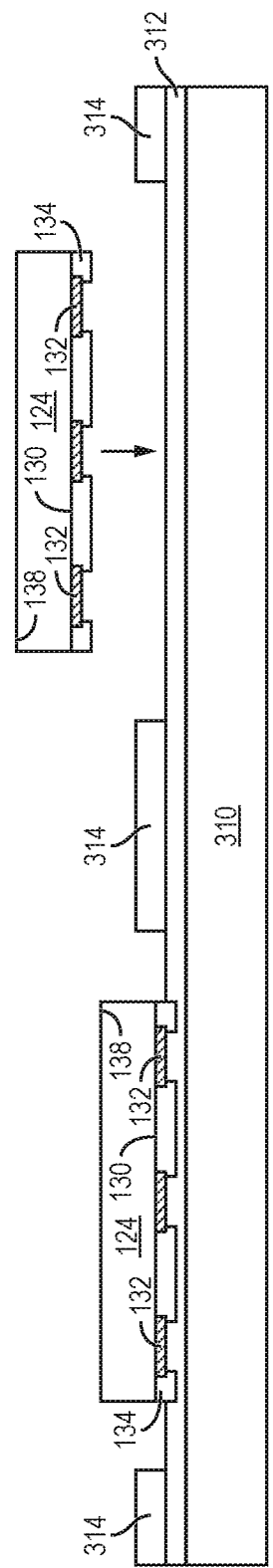

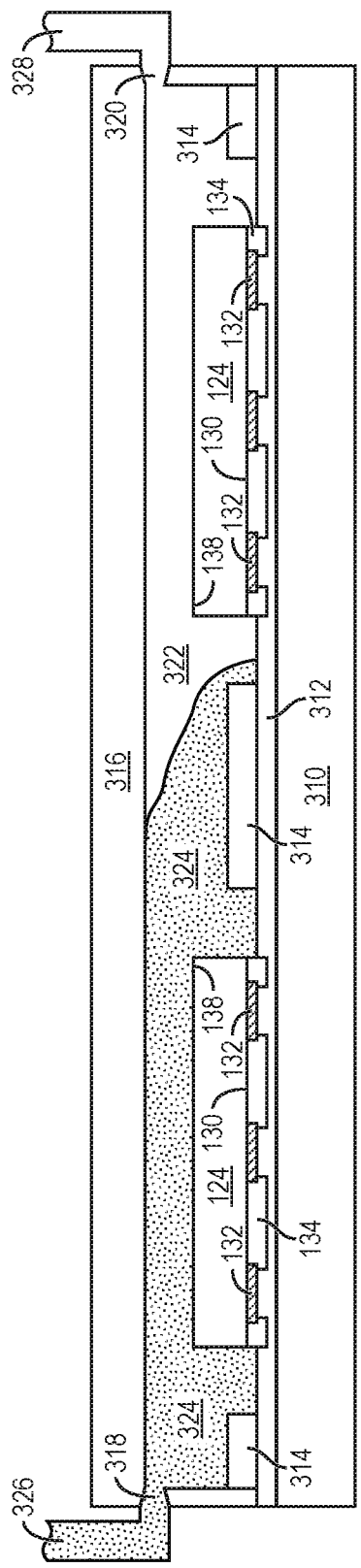

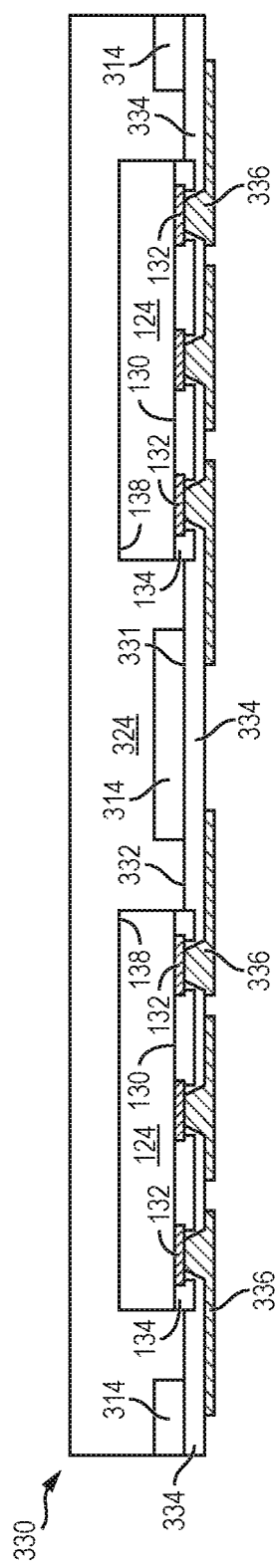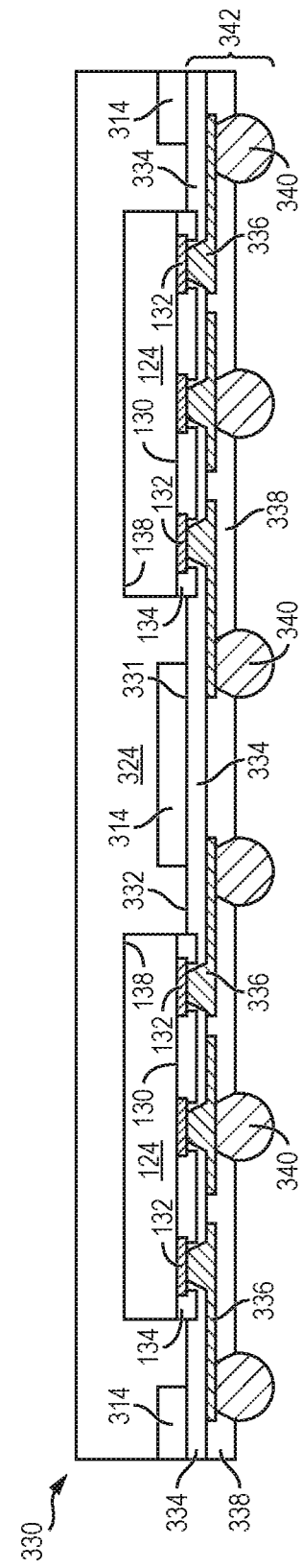

SEMICONDUCTOR DEVICE AND METHOD OF FORMING SUPPORTING LAYER OVER SEMICONDUCTOR DIE IN THIN FAN-OUT WAFER LEVEL CHIP SCALE PACKAGE

CLAIM TO DOMESTIC PRIORITY

The present application is a continuation of U.S. patent application Ser. No. 13/630,912, now U.S. Pat. No. 9,385,102, filed Sep. 28, 2012, which application is incorporated herein by reference.

FIELD OF THE INVENTION

The present invention relates in general to semiconductor devices and, more particularly, to a semiconductor device and method of forming a supporting layer over a semiconductor die in a thin fan-out wafer level chip scale package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in front-end processing resulting in semiconductor die with smaller, higher density active and passive components. Improvements in back-end processing can also result in semiconductor device packages with a smaller footprint by improving electrical interconnection and packaging materials.

Packaging improvements for semiconductor devices having smaller footprints include an effort to produce thin fan-out wafer level chip scale packages (fo-WLCSPs) including thicknesses less than or equal to 450 micrometers ($\mu$m) and improved temperature cycling (TC) performance. However, producing packages with thicknesses less than or equal to 450 $\mu$m using back grinding to expose a back surface of a semiconductor die can damage the semiconductor die, reduce performance, and reduce package strength, including strength necessary for mounting the fo-WLCSP in subsequent surface mount technology (SMT) processes. Furthermore, a semiconductor die having a thickness less than a thickness of the final thickness of the fo-WLCSP results in package warpage that causes problems for substrate handling during package processing. Another challenge associated with thin fo-WLCSPs includes forming packages with a fixed encapsulant material that results in a limited ability to adjust an effective coefficient of thermal expansion (CTE) for the package as a whole.

SUMMARY OF THE INVENTION

A need exists for a process of forming a supporting layer over a semiconductor die in a thin fo-WLCSP. Accordingly, in one embodiment, the present invention is a method of making a semiconductor device including the steps of providing a first supporting layer with an opening in the first supporting layer, disposing a semiconductor die within the opening of the first supporting layer, and depositing an encapsulant over the semiconductor die and first supporting layer.

In another embodiment, the present invention is a method of making a semiconductor device including the steps of providing a semiconductor die, forming a first supporting layer in a peripheral region around the semiconductor die, and depositing an encapsulant over the semiconductor die and first supporting layer.

In another embodiment, the present invention is a semiconductor device comprising a first supporting layer and semiconductor die disposed within an opening of the first supporting layer. An encapsulant is deposited over the semiconductor die and first supporting layer.

In another embodiment, the present invention is a semiconductor device including a semiconductor die and first supporting layer disposed in a peripheral region around the semiconductor die. An encapsulant is deposited over the semiconductor die and first supporting layer.

BRIEF DESCRIPTION OF THE DRAWINGS

FIGS. 4a-4j illustrate a process of forming a supporting layer over a semiconductor die in a thin fo-WLCSP;

FIGS. 7a-7j illustrate a process of forming a supporting layer over a semiconductor die in a thin fo-WLCSP;

FIGS. 10a-10k illustrate a process of forming a supporting layer over a semiconductor die in a thin fo-WLCSP;

DETAILED DESCRIPTION OF THE DRAWINGS

Figure 1:
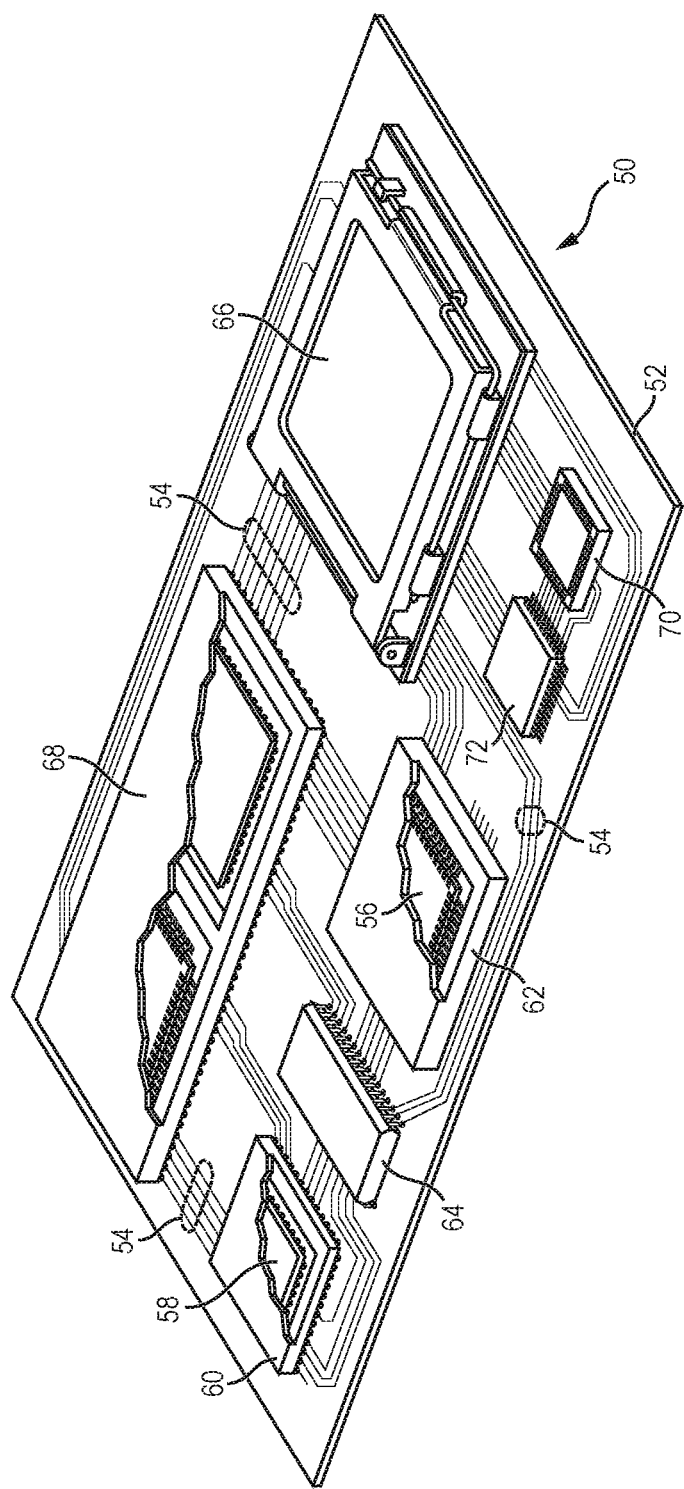
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the above-mentioned products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
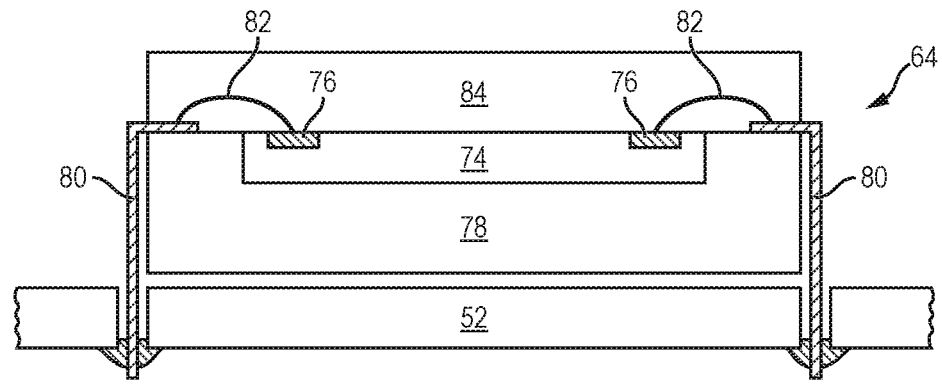
FIGS. 2a-2c illustrate further detail of the representative semiconductor packages mounted to the PCB.
Figure 2B:
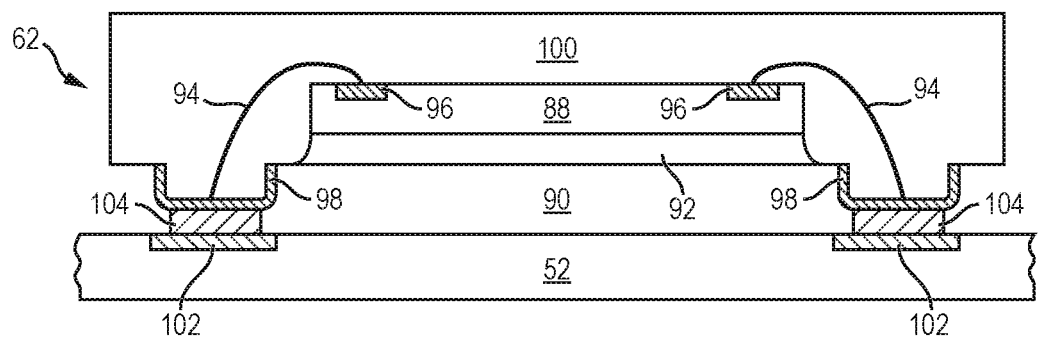
Figure 2C:
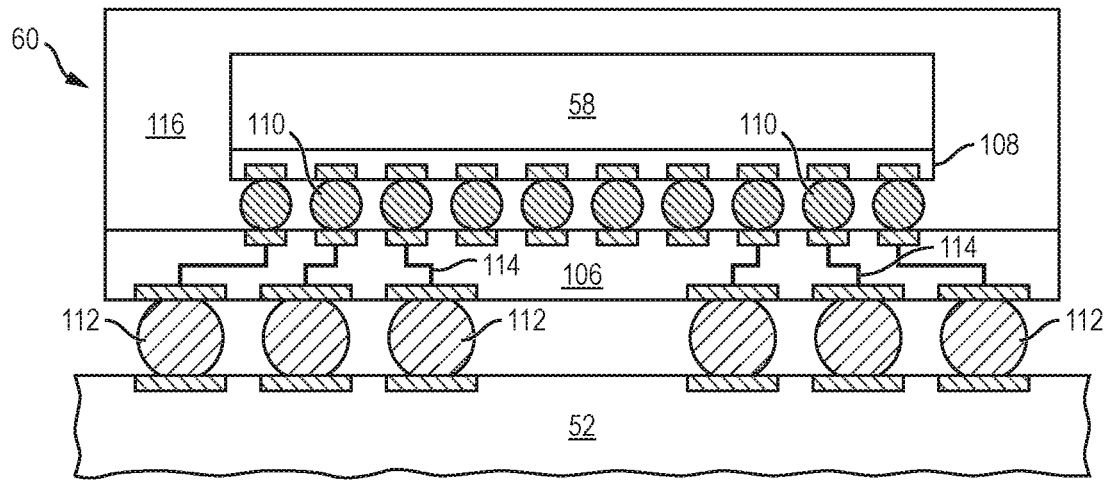

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
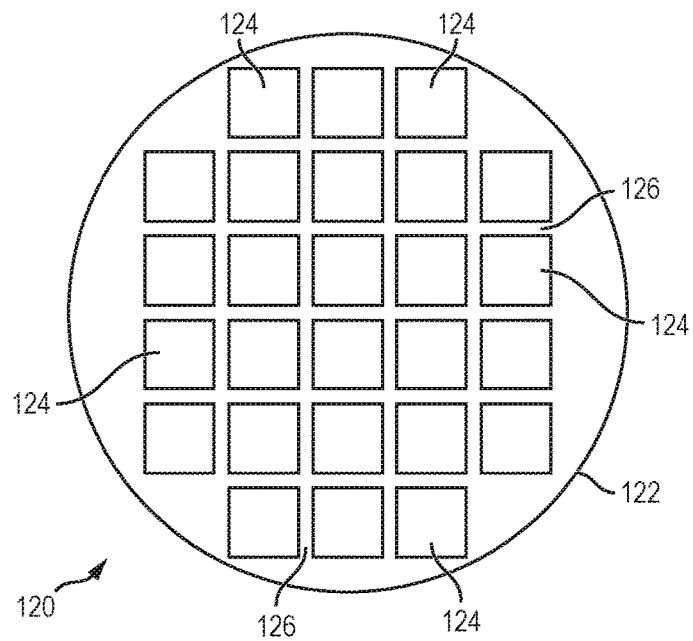
FIGS. 3a-3h illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on semiconductor wafer 120 separated by a non-active, inter-die wafer area or saw street 126 as described above. Saw street 126 provides cutting areas to singulate semiconductor wafer 120 into strips of semiconductor die or individual semiconductor die 124.

Figure 3B:
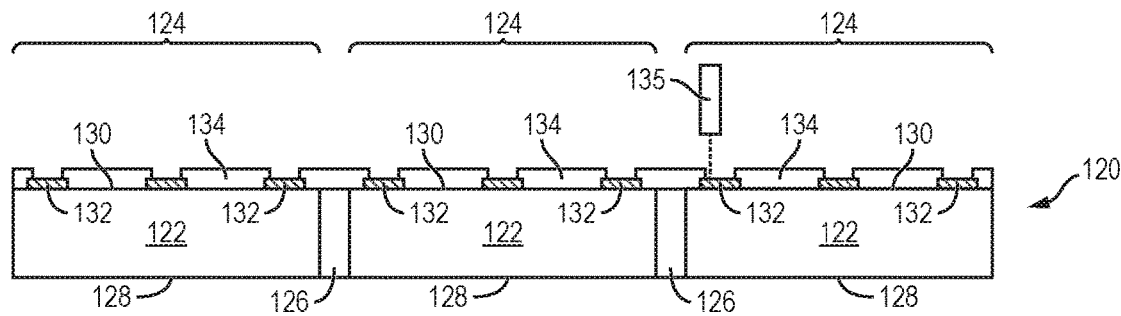

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is conformally applied to active surface 130 and conductive layer 132 using PVD, CVD, screen printing, spin coating, spray coating, sintering or thermal oxidation. The insulating layer 134 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The insulating layer 134 includes a first surface that follows a contour of active surface 130 and conductive layer 132, and a second surface opposite the first surface that is substantially planar. A portion of insulating layer 134 is removed by laser 135 using laser direct ablation (LDA) or other suitable process to form openings over conductive layer 132.

Figure 3C:
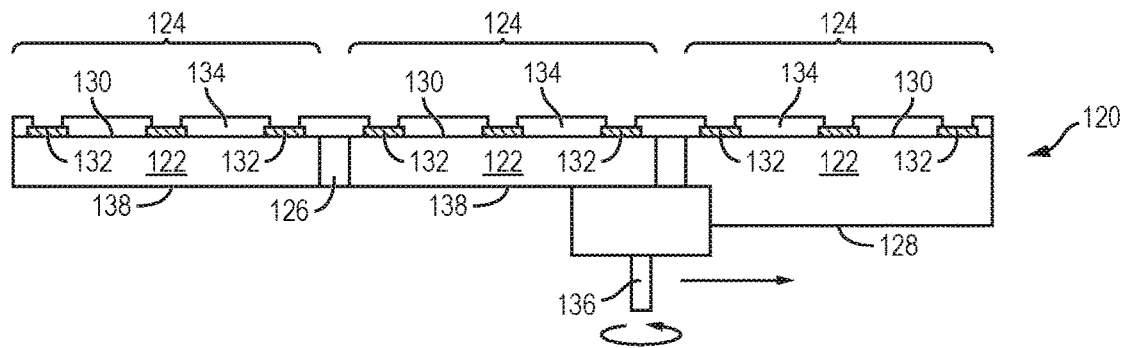

FIG. 3c shows back surface 128 of semiconductor wafer 120 undergoes a grinding operation with grinder 136. Grinder 136 removes base substrate material 122 of semiconductor wafer 120 and exposes a back surface 138 of the semiconductor wafer and of semiconductor die 124. A chemical etch, polishing, wet or dry CMP, or other suitable process can also be used to remove base substrate material 122, including mechanical damage and backgrinding damage, and to planarize semiconductor wafer 120. Removal of excess base substrate material 122 from semiconductor wafer 120 and semiconductor die 124 results in a planar back surface 138 and reduced thickness of the wafer. In one embodiment, semiconductor wafer 120 includes a thickness less than or equal to 450 µm. The reduced thickness of wafer 120 facilitates reduction of an overall package height for use in applications requiring reduced package size.

Figure 3D:
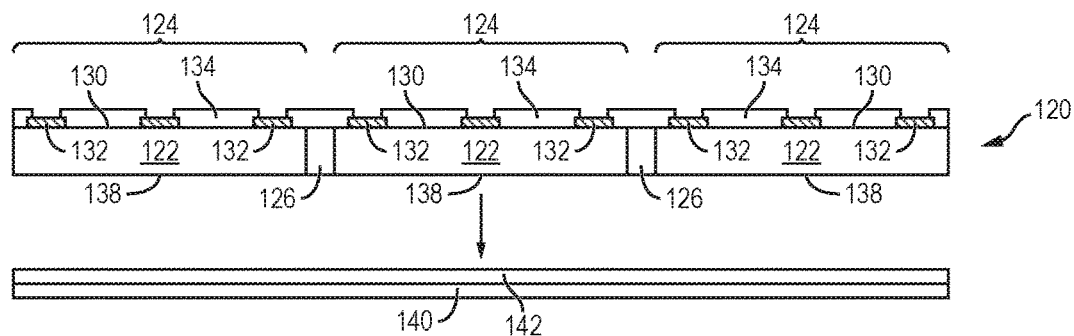

In FIG. 3d, semiconductor wafer 120 from FIG. 3c is mounted to a supporting substrate, supporting layer, or silicon dummy wafer 140 with back surface 138 oriented toward the substrate. Supporting substrate 140 contains base material such as metal, silicon, polymer, polymer composite, ceramic, glass, glass epoxy, beryllium oxide, or other suitable low-cost, rigid material or bulk semiconductor material for structural support. In one embodiment, supporting substrate 140 includes a material selected to have a CTE very close to a CTE of silicon, e.g., tuned glass with a CTE less than 10 ppm/K. Alternatively, supporting substrate 140 includes a material selected to have a CTE similar to, or much higher than, silicon, e.g., a polymer composite material with a CTE in a range of 4-150 ppm/K. A CTE of supporting substrate 140 is selected according to the configuration and design of a final package structure and application such that a CTE of the substrate produces a tuning effect with respect to the final semiconductor package. Properties of supporting substrate 140 including thickness, mechanical strength, thermal properties, and insulation are selected according to the configuration and design of a final package structure and application. Supporting substrate 140 provides additional support for thinned semiconductor wafer 120 and protects back surface 138 of semiconductor die 124. Supporting substrate 140 prevents breakage of thinned base substrate material 122 during handling and processing of the subsequently formed semiconductor packages. Supporting substrate 140 also assists with warpage control for base substrate material 122 of the semiconductor wafer and semiconductor die 124.

An optional adhesive or interface layer 142 can be formed over supporting substrate 140 as a temporary adhesive bonding film, double-sided tape, or etch-stop layer. Adhesive 142 is a die attach adhesive, epoxy, or other adhesive material, and in one embodiment, has a thickness in a range of 5-20 μm and is laminated to supporting substrate 140. Back surface 138 of semiconductor wafer 120 is mounted to adhesive 142 when the adhesive is present on supporting substrate 140 such that adhesive 142 is disposed between semiconductor wafer 120 and the supporting substrate. Alternatively, back surface 138 of semiconductor wafer 120 is mounted directly to supporting substrate 140 rather than to adhesive 142.

Figure 3E:
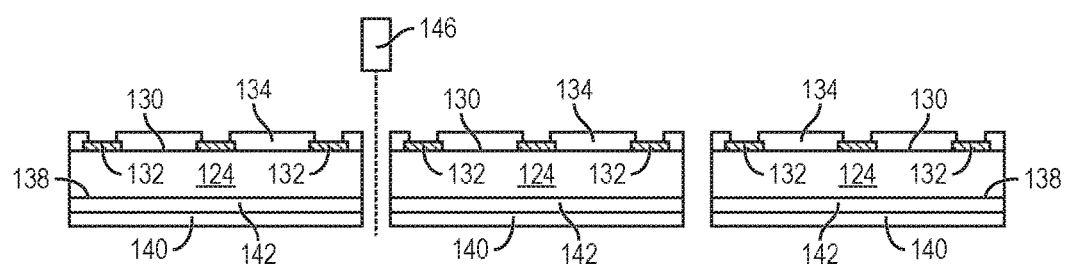

In FIG. 3e, thinned semiconductor wafer 120, supporting substrate 140, and adhesive 142 are singulated through saw street 126 using a saw blade or laser cutting tool 146 into individual semiconductor die 124. Supporting substrate 140 is coextensive with semiconductor die 124 such that an area of a footprint of the supporting substrate is equal to an area of a footprint of the semiconductor die. Thinned semiconductor die 124 with supporting substrate 140 provide a reduced height for packages requiring reduced package heights and further provide additional structural support, reduce package warpage, and facilitate subsequent processing and handling.

Figure 3F:
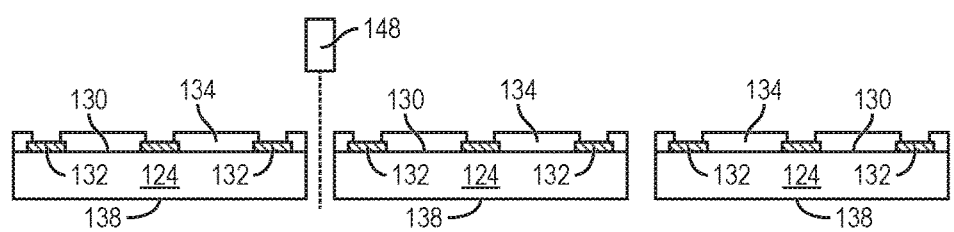

FIG. 3f, continuing from FIG. 3c, shows thinned semiconductor wafer 120 is singulated through saw street 126 using a saw blade or laser cutting tool 148 into strips of semiconductor die or individual semiconductor die 124.

Figure 3G:
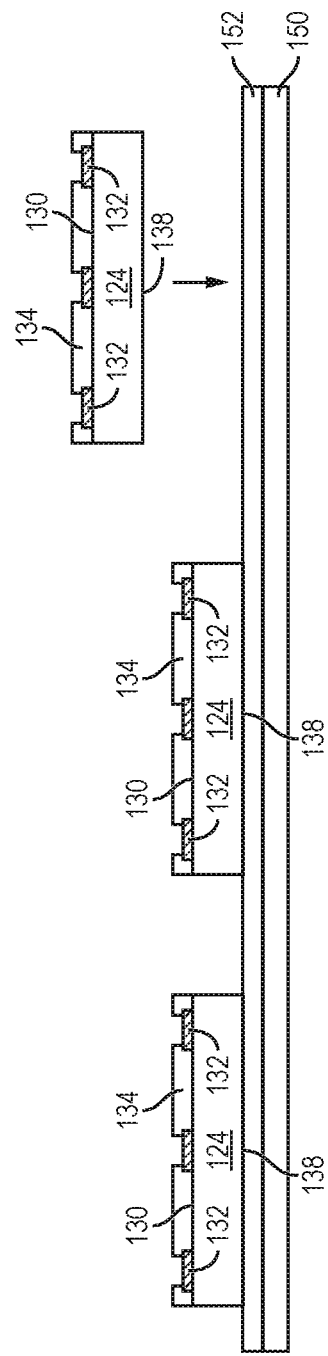

FIG. 3g, continuing from FIG. 3f, shows individual semiconductor die 124 mounted to the supporting substrate 150 with back surface 138 oriented toward the substrate. Supporting substrate 150, similar to supporting substrate 140 from FIG. 3d, contains base material such as metal, silicon, polymer, polymer composite, ceramic, glass, glass epoxy, beryllium oxide, or other suitable low-cost, rigid material or bulk semiconductor material for structural support. In one embodiment, supporting substrate 150 includes a core material formed with epoxy and glass fibers. Substrate 150 includes a material selected to have a CTE very close to a CTE of silicon, e.g., tuned glass with a CTE less than 10 ppm/K. Alternatively, supporting substrate 150 includes a material selected to have a CTE similar to, or much higher than, silicon, e.g., a polymer composite material with a CTE in a range of 4-150 ppm/K. A CTE of supporting substrate 150 is designed such that a CTE of the substrate produces a tuning effect with respect to the final semiconductor package. Properties of substrate 150, including thickness, mechanical strength, thermal properties, and insulation, are selected according to the configuration and design of a final package structure and application. Supporting substrate 150 provides additional support for thinned semiconductor die 124 and protects back surface 138 of the semiconductor die. Supporting substrate 150 prevents breakage of thinned base substrate material 122 during handling and processing of the subsequently formed semiconductor packages. Supporting substrate 150 also assists with warpage control for base substrate material 122 of semiconductor die 124.

An optional adhesive or interface layer 152 can be formed over carrier 150 as a temporary adhesive bonding film, double-sided tape, or etch-stop layer. Adhesive 152 is a die attach adhesive, epoxy, or other adhesive material, and in one embodiment, adhesive 152 has a thickness in a range of 5-20 μm and is laminated to supporting substrate 150. Back surface 138 of semiconductor die 124 is mounted to adhesive 152 when the adhesive is present on supporting substrate 150 such that adhesive 152 is disposed between semiconductor die 124 and the supporting substrate. Alternatively, back surface 138 of semiconductor die 124 is mounted directly to supporting substrate 150 rather than to adhesive 152.

Figure 3H:
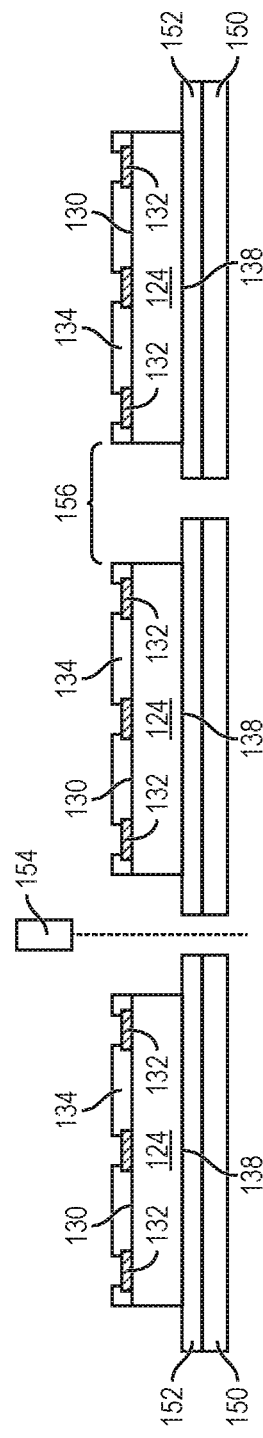

In FIG. 3h, supporting substrate 150 is singulated between semiconductor die 124 using a saw blade or laser cutting tool 154. Singulation occurs in peripheral area 156 located outside a footprint of semiconductor die 124 and between adjacent semiconductor die. Singulation is through both substrate 150 and adhesive 152 or, alternatively, through only substrate 150. When singulation is only through supporting substrate 150, adhesive 152 is disposed in less than an entirety of peripheral area 156. Adhesive 152 is disposed in less than an entirety of peripheral area 156 by being initially deposited on less than an entirety of the substrate, or by removal of a portion of the adhesive, e.g., by LDA, etching, or other suitable process. Singulation can occur before or after adhesive 152 undergoes an optional curing process. By singulating supporting substrate 150 through peripheral area 156, the supporting substrate includes an area or footprint greater than an area or footprint of semiconductor die 124. In other words, semiconductor die 124 includes an area or footprint less than an area or footprint of a singulated portion of supporting substrate 150 attached to the semiconductor die. In another embodiment, supporting substrate 150 includes an area or footprint equal to an area or footprint of semiconductor die 124. A size and CTE of the singulated supporting substrate protects back surface 138 of semiconductor die 124 and produces a tuning effect with the subsequently formed semiconductor package to control package warpage. Supporting substrate 150 is formed as a solid panel or as a panel with openings or holes such that the holes within the supporting substrate reduce overall package warpage and further facilitate subsequent molding of the supporting substrate and semiconductor die 124. When the supporting substrate includes an area or footprint greater than an area or footprint of semiconductor die 124, openings in supporting substrate 150 are formed in peripheral area 156 and are disposed outside and surrounding a footprint of the semiconductor die. Thus, singulated semiconductor die 124 together with supporting substrate 150 provide a reduced height for packages requiring reduced package heights and further provide additional structural support to reduce package warpage and facilitate subsequent processing and handling.

Figure 4C:
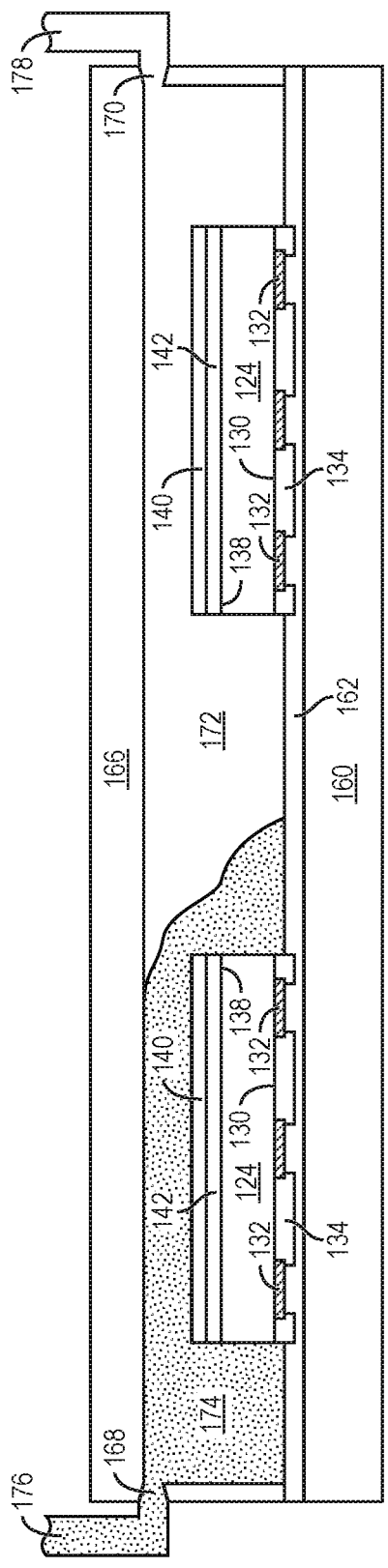

FIGS. 4a-4j illustrate, in relation to FIGS. 1 and 2a-2c, a process of forming a supporting layer over a semiconductor die in a thin fo-WLCSP. FIG. 4a shows a cross-sectional view of a portion of a carrier or temporary substrate 160 containing sacrificial base material such as silicon, polymer, beryllium oxide, glass, or other suitable low-cost, rigid material for structural support. An interface layer or double-sided tape 162 is formed over carrier 160 as a temporary adhesive bonding film, etch-stop layer, or thermal release layer.

In FIG. 4b, semiconductor die 124 from FIG. 3e or 3h are mounted to interface layer 162 and over carrier 160 using, for example, a pick and place operation with active surface 130 oriented toward the carrier. Semiconductor die 124 are pressed into interface layer 162 such that a portion of insulating layer 134 or semiconductor die 124 is disposed within, and surrounded by, the interface layer.

In FIG. 4c, carrier 160 and semiconductor die 124 are placed in chase mold 166 having a plurality of inlets 168 and 170, and a cavity 172. Carrier 160 is placed into chase mold 166 so that semiconductor die 124 are disposed within cavity 172. A volume of encapsulant or molding compound 174 is injected from dispenser 176 under an elevated temperature and pressure through inlet 168 into cavity 172, over and around semiconductor die 124, and over carrier 160. Inlet 170 can be an exhaust port with optional vacuum assist 178 for excess encapsulant 174. Encapsulant 174 can be a polymer composite material, such as epoxy resin with filler, epoxy acrylate with filler, or polymer with proper filler. Encapsulant 174 is non-conductive, provides physical support, and environmentally protects semiconductor die 124 from external elements and contaminants. A volume of encapsulant 174 is measured according to the space requirements of cavity 172 less the area occupied by semiconductor die 124. Encapsulant 174 is evenly dispersed and uniformly distributed under an elevated temperature within cavity 172 and around semiconductor die 124.

Figure 4D:
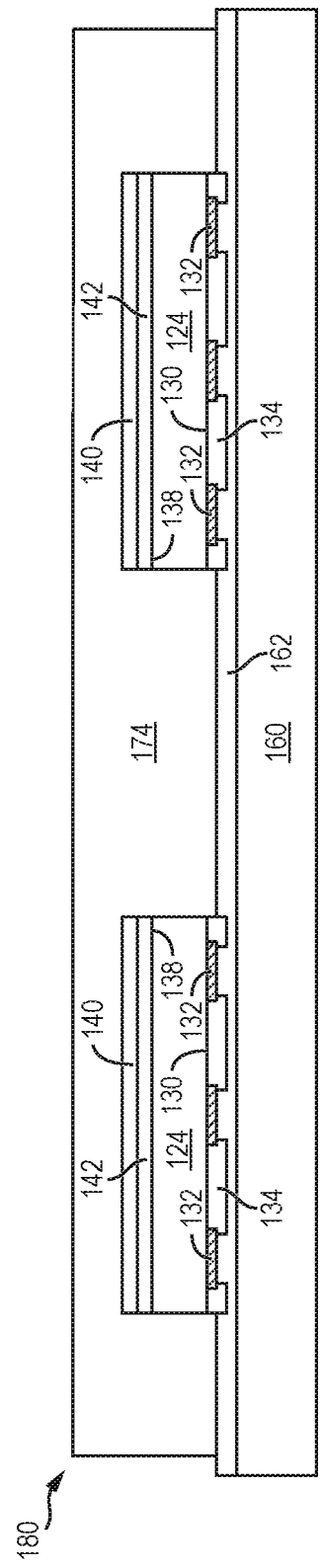

FIG. 4d shows composite substrate or reconstituted wafer 180 covered by encapsulant 174. Encapsulant 174 can be formed as a portion of composite substrate 180 in a chase mold as depicted in FIG. 4c, and as recited in the supporting text. Alternatively, encapsulant 174 can be formed as a portion of composite substrate 180 using a paste printing, compressive molding, transfer molding, liquid encapsulant molding, vacuum lamination, or other suitable applicator. Encapsulant 174 is formed over supporting substrate 140 and back surface 138 of semiconductor die 124, and can be thinned in a subsequent backgrinding step. Encapsulant 174 can also be deposited such that the encapsulant is coplanar with back surface 138 or supporting substrate 140, and does not cover the back surface or supporting substrate. In either case, encapsulant 174 facilitates the subsequent formation of a fan-out build-up interconnect structure over encapsulant 174 and semiconductor die 124.

Figure 4E:
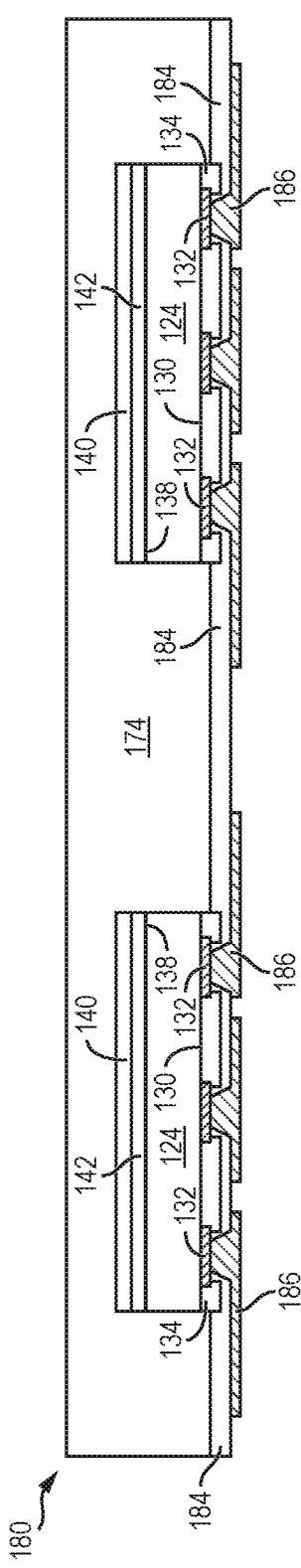

In FIG. 4e, carrier 160 and interface layer 162 are removed from composite substrate 180 by chemical etching, mechanical peeling, chemical mechanical planarization (CMP), mechanical grinding, thermal bake, UV light, laser scanning, or wet stripping to facilitate the formation of an interconnect structure over active surface 130 of semiconductor die 124 and encapsulant 174.

FIG. 4e also shows a first portion of a fan-out build-up interconnect structure or RDL is formed by the deposition and patterning of insulating or passivation layer 184. Insulating layer 184 is conformally applied to, and has a first surface that follows the contours of, encapsulant 174, insulating layer 134, semiconductor die 124, and conductive layer 132. Insulating layer 184 has a second planar surface opposite the first surface. Insulating layer 184 contains one or more layers of SiO2, Si3N4, SiON, Ta2O5, Al2O3, or other material having similar insulating and structural properties. Insulating layer 184 is deposited using PVD, CVD, printing, spin coating, spray coating, sintering, thermal oxidation, or other suitable process. A portion of insulating layer 184 is removed by an exposure or development process, LDA, etching, or other suitable process to form openings over conductive layer 132. The openings expose conductive layer 132 of semiconductor die 124 for subsequent electrical interconnect.

An electrically conductive layer 186 is patterned and deposited over insulating layer 184, over semiconductor die 124, and disposed within the openings in insulating layer 184 to fill the openings and contact conductive layer 132. Conductive layer 186 is one or more layers, including seed layers, that include Al, Cu, Sn, Ni, Au, Ag, titanium (Ti)/Cu, titanium tungsten (TiW)/Cu, Ti/nickel vanadium (NiV)/Cu, TiW/NiV/Cu, or other suitable electrically conductive material. The deposition of conductive layer 186 uses PVD, CVD, electrolytic plating, electroless plating, or other suitable process. In one embodiment, the deposition of conductive layer 186 includes selective plating with a seed layer and lithography. Conductive layer 186 operates as an RDL to fan-out and extend electrical connection from semiconductor die 124 to points external to semiconductor die 124.

Figure 4F:
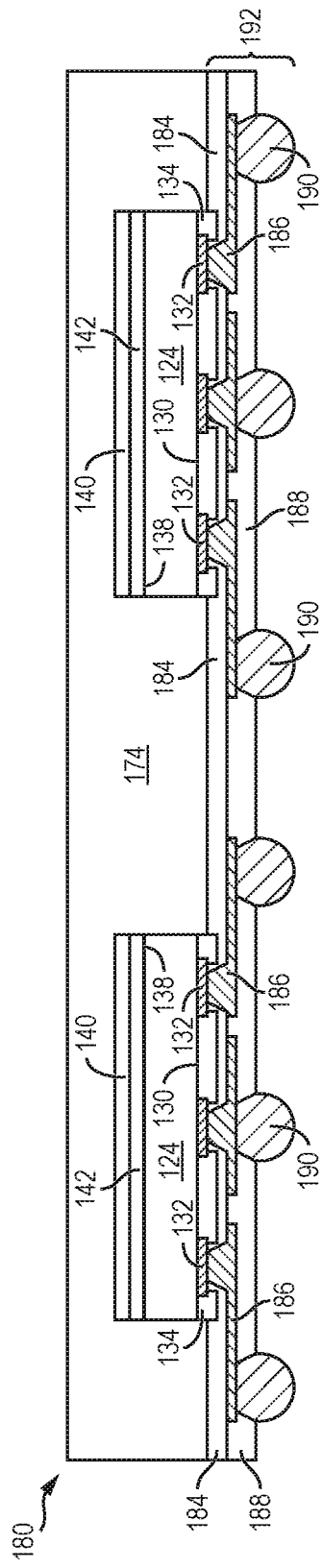

In FIG. 4f, an insulating or passivation layer 188 is conformally applied to, and follows the contours of, insulating layer 184 and conductive layer 186. Insulating layer 188 contains one or more layers of SiO2, Si3N4, SiON, Ta2O5, Al2O3, or other material having similar insulating and structural properties. Insulating layer 188 is deposited using PVD, CVD, printing, spin coating, spray coating, sintering, thermal oxidation, or other suitable process. A portion of insulating layer 188 is removed by an exposure or development process, LDA, etching, or other suitable process to form openings in the insulating layer, which expose portions of conductive layer 186 for subsequent electrical interconnection.

FIG. 4f also shows an electrically conductive bump material is deposited over conductive layer 186 and within the openings in insulating layer 188 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 190. In some applications, bumps 190 are reflowed a second time to improve electrical contact to conductive layer 186. In one embodiment, bumps 190 are formed over a UBM having a wetting layer, barrier layer, and adhesive layer. The bumps can also be compression bonded or thermocompression bonded to conductive layer 186. Bumps 190 represent one type of interconnect structure that can be formed over conductive layer 186. The interconnect structure can also use bond wires, conductive paste, stud bump, micro bump, or other electrical interconnect.

Taken together, insulating layers 184 and 188, as well as conductive layer 186 and conductive bumps 190 form a build-up interconnect structure 192. The number of insulating and conductive layers included within interconnect structure 192 depends on, and varies with, the complexity of the circuit routing design. Accordingly, interconnect structure 192 can include any number of insulating and conductive layers to facilitate electrical interconnect with respect to semiconductor die 124. In one embodiment, interconnect structure 192 includes a thickness in a range of 10-300 μm.

Figure 4G:
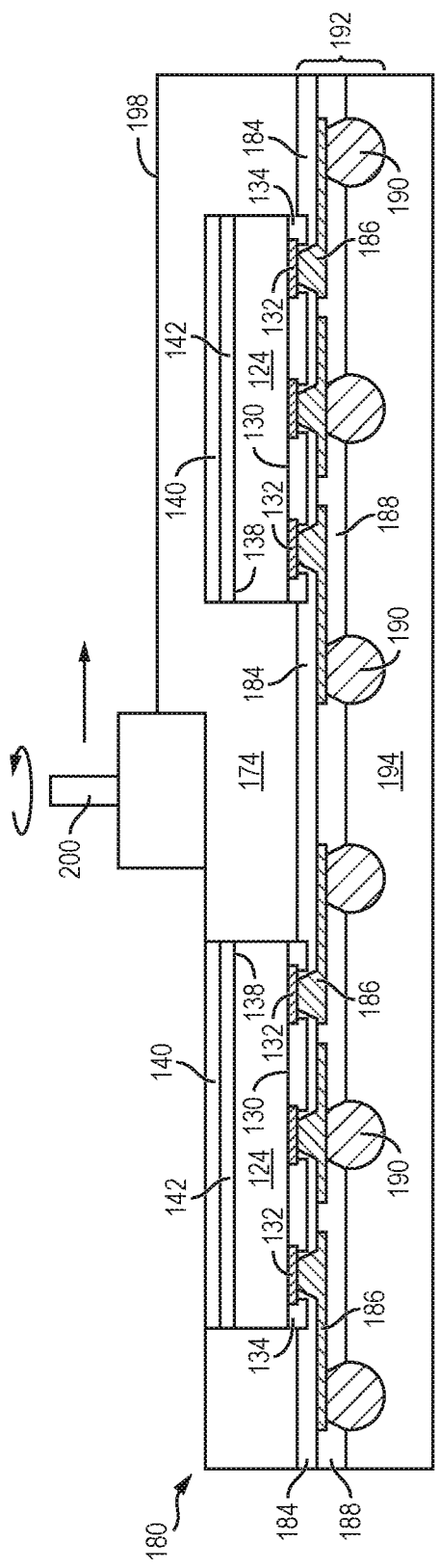

In FIG. 4g, an optional carrier or temporary substrate 194 is disposed over interconnect structure 192. Carrier 194 includes a backgrinding tape, supporting tape, and other carriers containing sacrificial base material such as silicon, polymer, beryllium oxide, glass, or other suitable low-cost, rigid material for structural support. Carrier 194 can include an interface layer, double-sided tape, and openings configured to receive composite substrate 180 and interconnect structure 192. Carrier 194 optionally provides additional support for subsequent processing steps of the semiconductor device shown in FIGS. 4g-4j. Alternatively, the subsequent processing steps for the semiconductor device are performed without carrier 194, and the additional support required for subsequent processing is provided by other components, such as encapsulant 174.

FIG. 4g further shows surface 198 of encapsulant 174 opposite interconnect structure 192 undergoes a grinding operation with grinder 200 to planarize the surface and reduce a thickness of the encapsulant. Optionally, the grinding operation also removes a portion of supporting substrate 140. A chemical etch or CMP process can also be used to remove mechanical damage resulting from the grinding operation and planarize encapsulant 174 and supporting substrate 140. In one embodiment, supporting substrate 140 includes a thickness in a range of 100-775 μm.

Figure 4H:
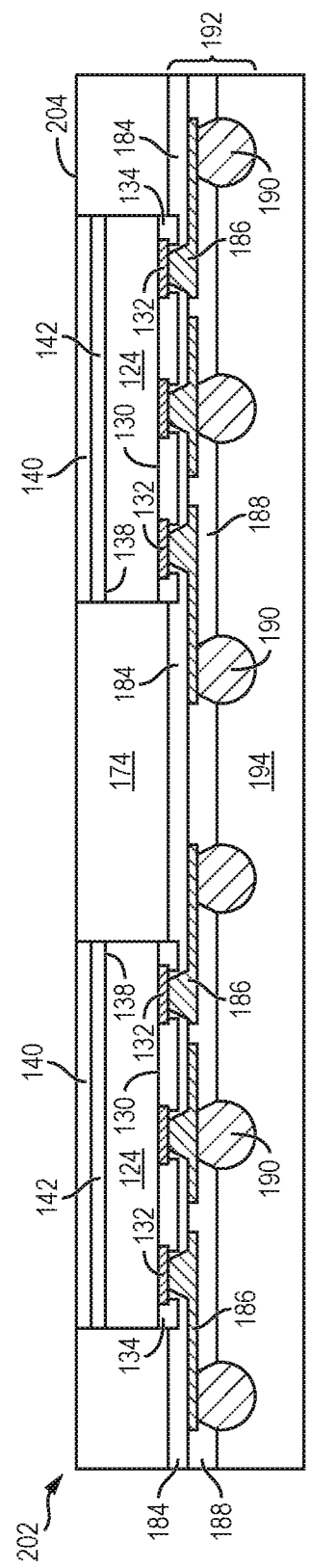

FIG. 4h shows a reconstituted wafer 202 including semiconductor die 124, encapsulant 174, build-up interconnect structure 192, and carrier 194. Supporting substrate 140 or adhesive 142 is partially exposed from encapsulant 174 and coplanar with surface 204 of encapsulant 174 opposite interconnect structure 192. In one embodiment, supporting substrate 140 or adhesive 142 is also exposed as part of a final semiconductor package. Accordingly reconstituted wafer 202 and carrier 194 are singulated with a saw blade or laser cutting device to form individual fan-out semiconductor packages including exposed supporting substrate 140 or adhesive 142. Singulation occurs before carrier 194 is removed by chemical etching, mechanical peeling, CMP, mechanical grinding, thermal bake, UV light, laser scanning, wet stripping, or other suitable process. Alternatively, carrier 194 is removed after completing the grinding of encapsulant 174 but before singulation.

Figure 4I:
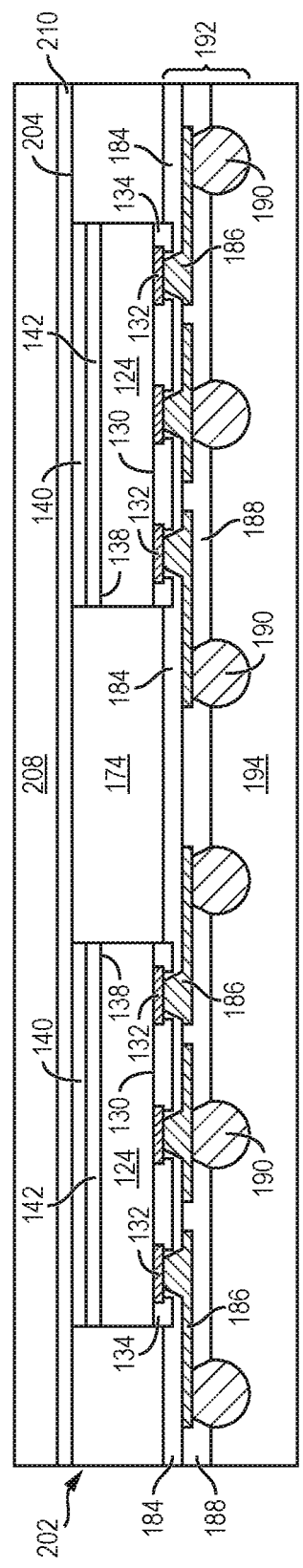

FIG. 4i shows an additional supporting layer 208 formed over an entirety of reconstituted wafer 202, including over surface 204 of encapsulant 174 and supporting substrate 140 opposite interconnect structure 192. Supporting layer 208 is a fiber enhanced polymer matrix composite material or other suitable material including one or more layers of phenolic cotton paper, epoxy, resin, woven glass, matte glass, carbon fibers, polyester, and other reinforcement fibers or fabrics arranged, e.g., in cross or short-cut formats. Fiber enhancement of supporting layer 208 reduces a problem of package weakness resulting from structures using molding compounds with only round silica filler. Supporting layer 208 includes a core layer and is formed as a pre-prepared composite sheet, which in one embodiment includes a thickness in a range of about 20-80 μm. Alternatively, supporting layer 208 is also applied over reconstituted wafer 202 as a sheet, tape, or paste. Supporting layer 208 is selected to have a thickness, CTE, mechanical strength, thermal properties, and insulation properties that provide both warpage control and enhance package strength. Adjusting the various attributes of supporting layer 208 allows for flexibility in protecting supporting substrate 140 or back surface 138 of the semiconductor die and in adjusting an effective CTE for the fo-WLCSP as a whole.

FIG. 4i also shows supporting layer 208 optionally attached to reconstituted wafer 202 with an adhesive or bonding layer 210. Adhesive layer 210 is an epoxy or other adhesive material, and in one embodiment, has a thickness in a range of 5-20 μm and is laminated to supporting substrate 140 and encapsulant 174 on a surface of reconstituted wafer 202 opposite interconnect structure 192. Supporting layer 208 and adhesive layer 210 optionally undergo a curing process. Carrier 194 is removed either before or after the curing process.

Figure 4J:
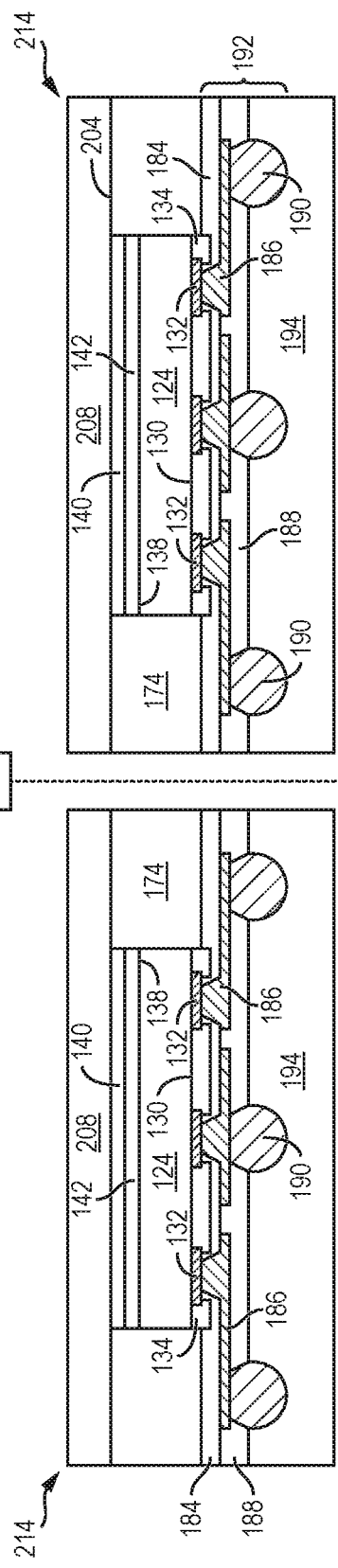

FIG. 4j shows reconstituted wafer 202 from FIG. 4i without optional adhesive layer 210. FIG. 4j further shows composite substrate 180, interconnect structure 192, carrier 194, and supporting layer 208 are singulated with saw blade or laser cutting device 212 into individual thin fo-WLCSPs 214. Fo-WLCSPs 214 are singulated before carrier 194 is removed by chemical etching, mechanical peeling, CMP, mechanical grinding, thermal bake, UV light, laser scanning, wet stripping, or other suitable process. Alternatively, carrier 194 is removed after completing the grinding of encapsulant 174 but before singulation.

Figure 5A:
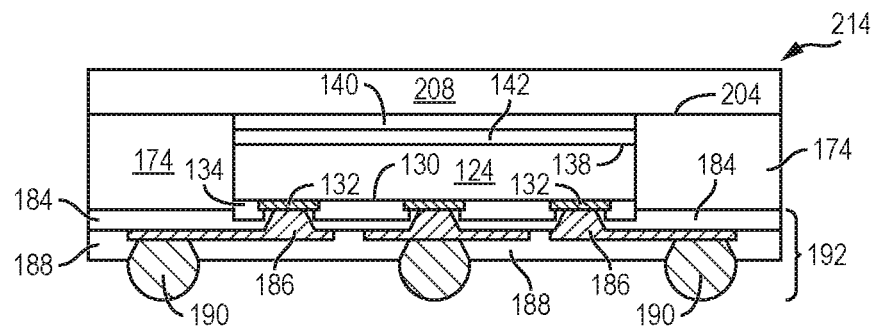
FIGS. 5a and 5b illustrate embodiments of a supporting layer formed over a semiconductor die in a thin fo-WLCSP.

FIG. 5a shows an individual fo-WLCSP 214, without carrier 194, that results from the singulation of reconstituted wafer 202 shown in FIG. 4j. Fo-WLCSP 214 is a thin package that provides fan-out horizontal electrical interconnection for semiconductor die 124 and offers a number of advantages over packages known in the prior art. For example, semiconductor die 124 includes a thickness less than or equal to 450 μm and facilitates reduction of an overall package height for use in applications requiring reduced package size. A final thickness of semiconductor die 124 is at least 1 μm less than a difference between a total thickness of fo-WLCSP 214 and thicknesses of interconnect structure 192 and supporting layer 208. A supporting substrate 140 is disposed over back surface of semiconductor die 124 and includes a material selected to have a CTE very close to a CTE of silicon, e.g., tuned glass with a CTE less than 10 ppm/K. Alternatively, supporting substrate 140 includes a material selected to have a CTE similar to, or much higher than, silicon, e.g., a polymer composite material with a CTE in a range of 4-150 ppm/K. Supporting substrate 140 provides support for semiconductor die 124. Supporting substrate 140 helps prevent breakage of thinned base substrate material 122 and assists with warpage control for semiconductor die 124 and fo-WLCSP 214. An encapsulant 174 is deposited around semiconductor die 124, and a fan-out build-up interconnect structure is formed over the encapsulant and semiconductor die. Surface 198 of encapsulant 174 opposite interconnect structure 192 undergoes a grinding operation with grinder 200 to planarize the surface and reduce a thickness of the encapsulant, and optionally removes a portion of supporting substrate 140. An additional supporting layer 208 is formed over encapsulant 174 and supporting substrate 140 opposite interconnect structure 192 that protects supporting substrate 140 or back surface 138 of the semiconductor die and adjusts an effective CTE of fo-WLCSP 214 as a whole. An area of a footprint of supporting layer 208 is greater than an area of a footprint of semiconductor die 124. An adhesive layer, similar to adhesive layer 210, is optionally attached between supporting layer 208 and reconstituted wafer 202.

Figure 5B:
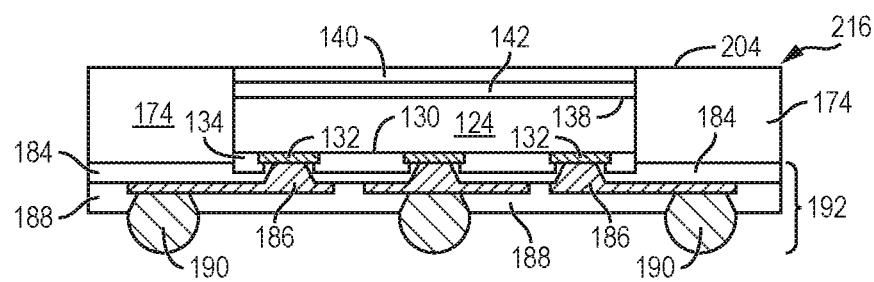

FIG. 5b shows an individual fo-WLCSP 216 without carrier 194 that results from the singulation of reconstituted wafer 202 in FIG. 4h. Fo-WLCSP 216 differs from fo-WLCSP 214 of FIG. 5a because fo-WLCSP 216 does not include optional supporting layer 208 or adhesive layer 210. Thus, supporting substrate 140 is exposed with respect to encapsulant 174 as a portion of an outer surface of fo-WLCSP 216. Supporting substrate 140 is exposed after a portion of encapsulant 174 is removed in a grinding process as described in relation to FIG. 4g. A final thickness of semiconductor die 124 is at least 1 μm less than a difference between a total thickness of fo-WLCSP 216 and a thickness of interconnect structure 192.

Figure 6A:
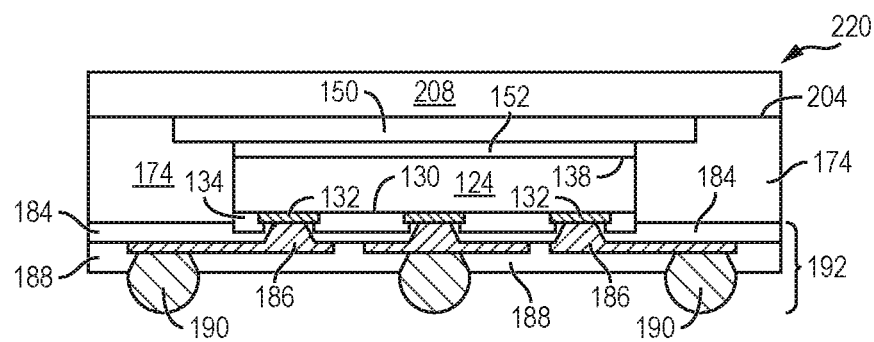
FIGS. 6a-6d illustrate embodiments of a supporting layer formed over a semiconductor die in a thin fo-WLCSP.

FIG. 6a shows an individual fo-WLCSP 220, similar to fo-WLCSP 214 from FIG. 5a, that is formed by the process described in FIGS. 4a-4j as described above in relation to FIG. 5a. Fo-WLCSP 220 includes semiconductor die 124 within a thin package that provides fan-out horizontal electrical interconnection for the semiconductor die. Fo-WLCSP 220 differs from fo-WLCSP 214 by the inclusion of semiconductor die 124 mounted to supporting substrate 150 with adhesive 152 as previously described in relation to FIGS. 3f-3h rather than packaging semiconductor die 124 with supporting substrate 140 and adhesive 142. Supporting substrate 150 includes an area or footprint greater than an area or footprint of semiconductor die 124. In other words, semiconductor die 124 includes an area or footprint less than an area or footprint of a singulated portion of supporting substrate 150 attached to the semiconductor die. A size and CTE of supporting substrate 150 is designed not only to protect back surface 138 of semiconductor die 124, but to produce a tuning effect with fo-WLCSP 220 to control package warpage. Supporting substrate 150 is formed in FIG. 6a as a solid panel to reduce overall package warpage and further facilitate subsequent molding of the supporting substrate and semiconductor die 124. Thus, singulated semiconductor die 124 together with supporting substrate 150 provide a reduced height for fo-WLCSP 220 and further provide additional structural support to reduce package warpage and also facilitate subsequent processing and handling.

FIG. 6a also shows additional supporting layer 208 formed over surface 204 of encapsulant 174 and over supporting substrate 150 opposite interconnect structure 192. Supporting layer 208 is a fiber enhanced polymer matrix composite material or other suitable material including one or more layers of phenolic cotton paper, epoxy, resin, woven glass, matte glass, carbon fibers, polyester, and other reinforcement fibers or fabrics arranged, e.g., in cross or short-cut formats. Supporting layer 208 includes a core layer and is formed as a pre-prepared composite sheet, which in one embodiment includes a thickness in a range of about 20-80 μm. Alternatively, supporting layer 208 is also applied over reconstituted wafer 202 as a sheet, tape, or paste. Supporting layer 208 is selected to have a thickness, CTE, mechanical strength, thermal properties, and insulation properties that provide both warpage control and enhance package strength. Adjusting the various attributes of supporting layer 208 allows for flexibility in protecting supporting carrier 150 and in adjusting an effective CTE for fo-WLCSP 220. As discussed in reference to FIG. 4i, an optional adhesive or bonding layer similar to adhesive 210 is also disposed between supporting layer 208 and supporting substrate 150 and between the supporting layer and encapsulant 174. A final thickness of semiconductor die 124 is at least 1 μm less than a difference between a total thickness of fo-WLCSP 220 and thicknesses of interconnect structure 192 and supporting layer 208.

Figure 6B:
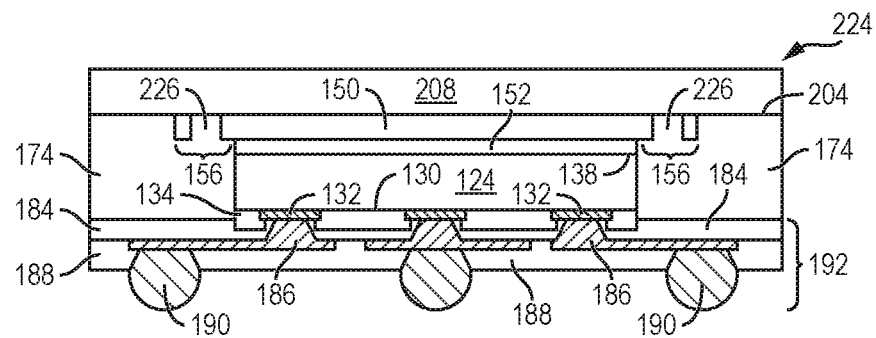

FIG. 6b shows an individual fo-WLCSP 224, similar to fo-WLCSP 220 in FIG. 6a. Fo-WLCSP 224 differs from fo-WLCSP 220 in that supporting substrate 150 is formed in FIG. 6b as a panel with openings or holes 226 formed in peripheral area 156. Openings 226 are disposed outside and surrounding a footprint of the semiconductor die. Openings 226 extend completely through supporting substrate 150 between opposing first and second surfaces of the supporting substrate, or alternatively, openings 226 extend only partially through the supporting substrate. Openings 226 operate to reduce overall package warpage and facilitate formation of encapsulant 174 by allowing the encapsulant to be disposed within the openings. Thus, singulated semiconductor die 124 together with supporting substrate 150 and openings 226 provide a reduced height for fo-WLCSP 224 and further provide additional structural support to reduce package warpage and facilitate package processing and handling. A final thickness of semiconductor die 124 is at least 1 μm less than a difference between a total thickness of fo-WLCSP 224 and thicknesses of interconnect structure 192 and supporting layer 208.

Figure 6C:
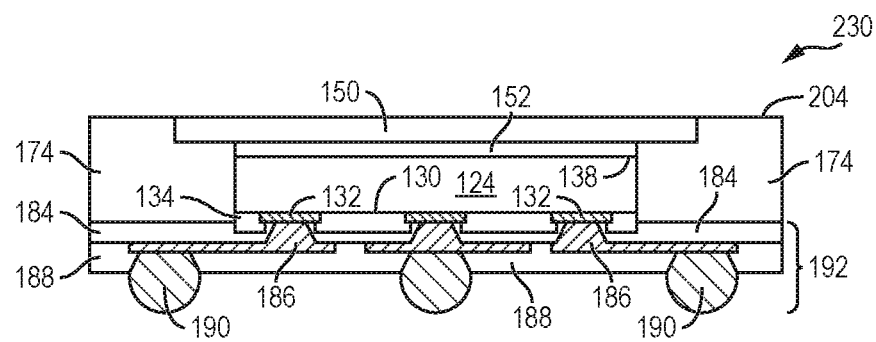

FIG. 6c shows an individual fo-WLCSP 230, similar to fo-WLCSP 220 in FIG. 6a. Fo-WLCSP 230 differs from fo-WLCSP 220 in that fo-WLCSP 230 does not include optional supporting layer 208 or adhesive layer 210. Without supporting layer 208, supporting substrate 150 is exposed with respect to encapsulant 174 as a portion of an outer surface of fo-WLCSP 230. Supporting substrate 150 is exposed after a portion of encapsulant 174 is removed in a grinding process as described in relation to FIG. 4g. As such, singulated semiconductor die 124 together with supporting substrate 150 provide a reduced height for fo-WLCSP 230 and further provide additional structural support to reduce package warpage and facilitate package processing and handling. A final thickness of semiconductor die 124 is at least 1 μm less than a difference between a total thickness of fo-WLCSP 230 and a thickness of interconnect structure 192.

Figure 6D:
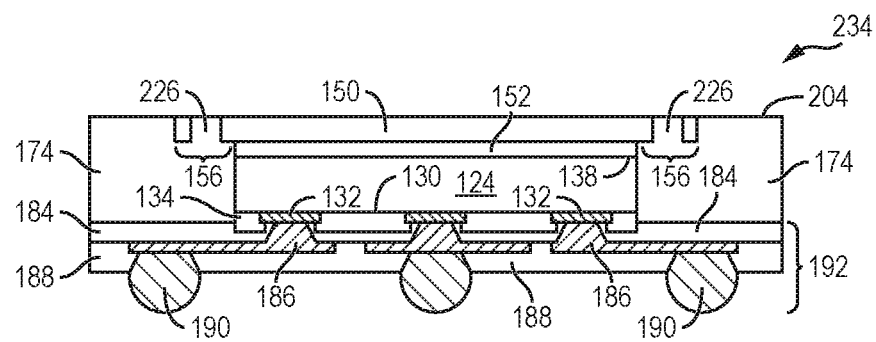

FIG. 6d shows an individual fo-WLCSP 234, similar to fo-WLCSP 224 in FIG. 6b. Fo-WLCSP 234 differs from fo-WLCSP 224 in that fo-WLCSP 234 does not include optional supporting layer 208. Without supporting layer 208, supporting substrate 150 is exposed with respect to encapsulant 174 as a portion of an outer surface of fo-WLCSP 234. Supporting substrate 150 is exposed after a portion of encapsulant 174 is removed in a grinding process as described in relation to FIG. 4g. As such, singulated semiconductor die 124 together with supporting substrate 150 provide a reduced height for fo-WLCSP 234 and further provide additional structural support to reduce package warpage and facilitate package processing and handling. A final thickness of semiconductor die 124 is at least 1 μm less than a difference between a total thickness of fo-WLCSP 234 and a thickness of interconnect structure 192.

Figure 7C:
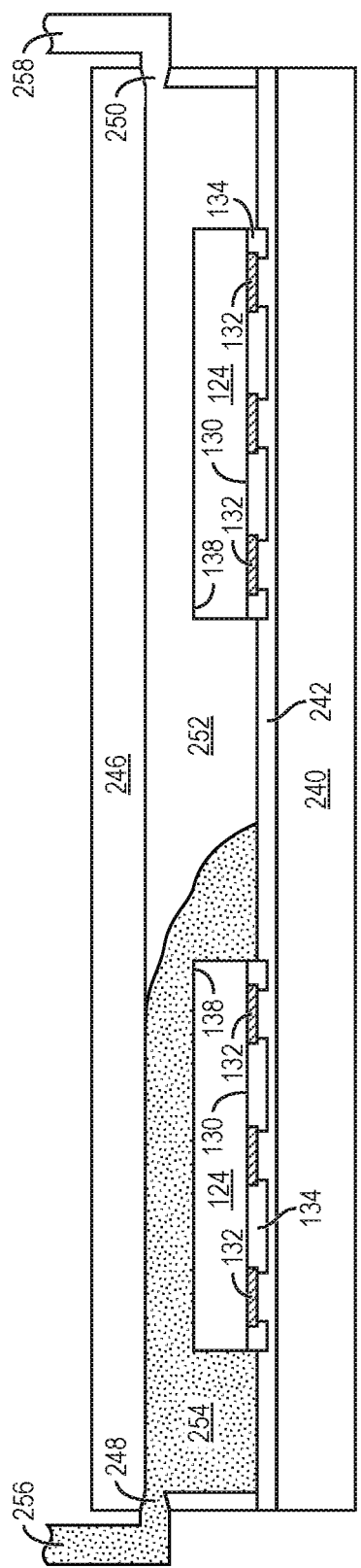

FIGS. 7a-7j illustrate, in relation to FIGS. 1 and 2a-2c, a process of forming a supporting layer over a semiconductor die in a thin fo-WLCSP. FIG. 7a shows a cross-sectional view of a portion of a carrier or temporary substrate 240 containing sacrificial base material such as silicon, polymer, beryllium oxide, glass, or other suitable low-cost, rigid material for structural support. An interface layer or double-sided tape 242 is formed over carrier 240 as a temporary adhesive bonding film, etch-stop layer, or thermal release layer.

In FIG. 7b, semiconductor die 124 from FIG. 3f are mounted to interface layer 242 and over carrier 240 using, for example, a pick and place operation with active surface 130 oriented toward the carrier. Semiconductor die 124 are pressed into interface layer 242 such that a portion of insulating layer 134 or semiconductor die 124 is disposed within, and surrounded by, the interface layer.

In FIG. 7c, carrier 240 and semiconductor die 124 are placed in chase mold 246 having a plurality of inlets 248 and 250, and a cavity 252. Carrier 240 is placed into chase mold 246 so that semiconductor die 124 are disposed within cavity 252. A volume of encapsulant or molding compound 254 is injected from dispenser 256 under an elevated temperature and pressure through inlet 248 into cavity 252, over and around semiconductor die 124, and over carrier 240. Inlet 250 can be an exhaust port with optional vacuum assist 258 for excess encapsulant 254. Encapsulant 254 can be a polymer composite material, such as epoxy resin with filler, epoxy acrylate with filler, or polymer with proper filler. Encapsulant 254 is non-conductive, provides physical support, and environmentally protects semiconductor die 124 from external elements and contaminants. A volume of encapsulant 254 is measured according to the space requirements of cavity 252 less the area occupied by semiconductor die 124. Encapsulant 254 is evenly dispersed and uniformly distributed under an elevated temperature within cavity 252 and around semiconductor die 124.

Figure 7D:
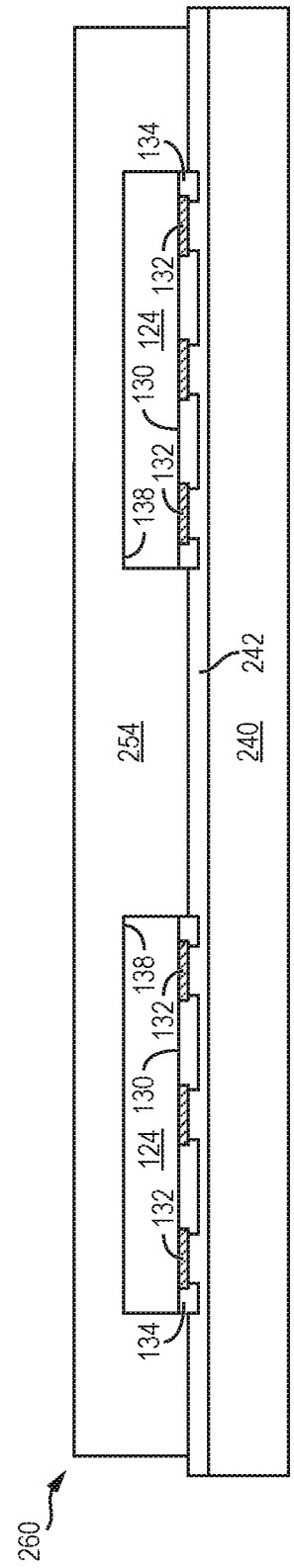

FIG. 7d shows composite substrate or reconstituted wafer 260 covered by encapsulant 254. Encapsulant 254 can be formed as a portion of composite substrate 260 in a chase mold as depicted in FIG. 7c, and as recited in the supporting text. Alternatively, encapsulant 254 can be formed as a portion of composite substrate 260 using a paste printing, compressive molding, transfer molding, liquid encapsulant molding, vacuum lamination, or other suitable applicator. Encapsulant 254 is formed over back surface 138 of semiconductor die 124, and can be thinned in a subsequent backgrinding step. Encapsulant 254 can also be deposited such that the encapsulant is coplanar with back surface 138 of semiconductor die 124 and does not cover the back surface. In either case, encapsulant 254 facilitates the subsequent formation of a fan-out build-up interconnect structure over encapsulant 254 and outside a footprint of semiconductor die 124.

Figure 7E:
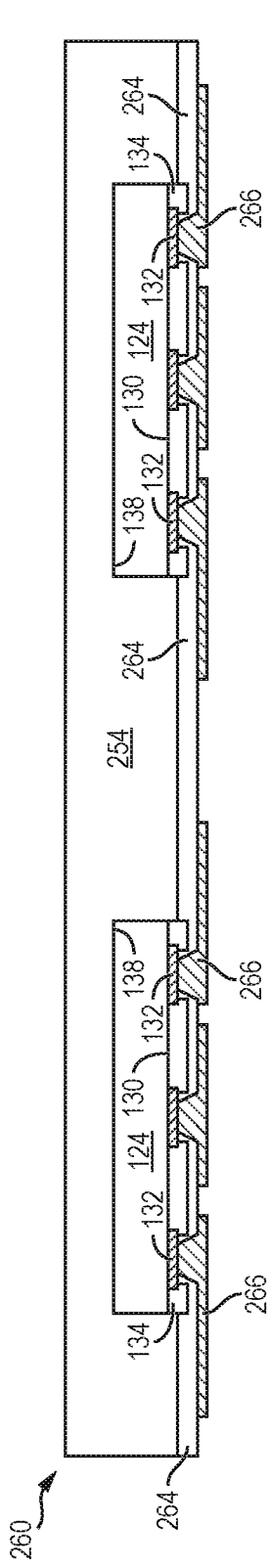

In FIG. 7e, carrier 240 and interface layer 242 are removed from composite substrate 260 by chemical etching, mechanical peeling, CMP, mechanical grinding, thermal bake, UV light, laser scanning, or wet stripping to facilitate the formation of an interconnect structure over active surface 130 of semiconductor die 124 and encapsulant 254.

FIG. 7e also shows a first portion of a fan-out build-up interconnect structure or RDL is formed by the deposition and patterning of insulating or passivation layer 264. Insulating layer 264 is conformally applied to, and has a first surface that follows the contours of, encapsulant 254, insulating layer 134, semiconductor die 124, and conductive layer 132. Insulating layer 264 has a second planar surface opposite the first surface. Insulating layer 264 contains one or more layers of SiO2, Si3N4, SiON, Ta2O5, Al2O3, or other material having similar insulating and structural properties. Insulating layer 264 is deposited using PVD, CVD, printing, spin coating, spray coating, sintering, thermal oxidation, or other suitable process. A portion of insulating layer 264 is removed by an exposure or development process, LDA, etching, or other suitable process to form openings over conductive layer 132. The openings expose conductive layer 132 of semiconductor die 124 for subsequent electrical interconnect.

An electrically conductive layer 266 is patterned and deposited over insulating layer 264, over semiconductor die 124, and disposed within the openings in insulating layer 264 to fill the openings and contact conductive layer 132. Conductive layer 266 is one or more layers, including seed layers, that include Al, Cu, Sn, Ni, Au, Ag, Ti/Cu, TiW/Cu, Ti/NiV/Cu, TiW/NiV/Cu, or other suitable electrically conductive material. The deposition of conductive layer 266 uses PVD, CVD, electrolytic plating, electroless plating, or other suitable process. In one embodiment, the deposition of conductive layer 266 includes selective plating with a seed layer and lithography. Conductive layer 266 operates as an RDL to fan-out and extend electrical connection from semiconductor die 124 to points external to semiconductor die 124.

Figure 7F:
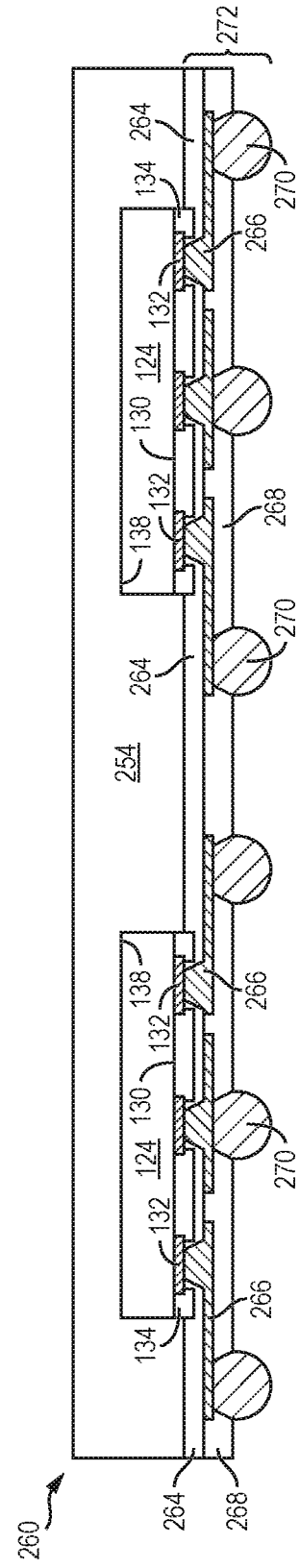

In FIG. 7f, an insulating or passivation layer 268 is conformally applied to, and follows the contours of, insulating layer 264 and conductive layer 266. Insulating layer 268 contains one or more layers of SiO2, Si3N4, SiON, Ta2O5, Al2O3, or other material having similar insulating and structural properties. Insulating layer 268 is deposited using PVD, CVD, printing, spin coating, spray coating, sintering, thermal oxidation, or other suitable process. A portion of insulating layer 268 is removed by an exposure or development process, LDA, etching, or other suitable process to form openings in the insulating layer, which expose portions of conductive layer 266 for subsequent electrical interconnection.

FIG. 7f also shows an electrically conductive bump material is deposited over conductive layer 266 and within the openings in insulating layer 268 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 266 using a suitable attachment or bonding process. In one embodiment, the bump material is reflowed by heating the material above its melting point to form spherical balls or bumps 270. In some applications, bumps 270 are reflowed a second time to improve electrical contact to conductive layer 266. In one embodiment, bumps 270 are formed over a UBM having a wetting layer, barrier layer, and adhesive layer. The bumps can also be compression bonded to conductive layer 266. Bumps 270 represent one type of interconnect structure that can be formed over conductive layer 266. The interconnect structure can also use bond wires, conductive paste, stud bump, micro bump, or other electrical interconnect.

Taken together, insulating layers 264 and 268, as well as conductive layer 266 and conductive bumps 270 form interconnect structure 272. The number of insulating and conductive layers included within interconnect structure 272 depends on, and varies with, the complexity of the circuit routing design. Accordingly, interconnect structure 272 can include any number of insulating and conductive layers to facilitate electrical interconnect with respect to semiconductor die 124.

In FIG. 7g, an optional carrier or temporary substrate 274 is disposed over interconnect structure 272. Carrier 274 includes a backgrinding tape, supporting tape, and other carriers containing sacrificial base material such as silicon, polymer, beryllium oxide, glass, or other suitable low-cost, rigid material for structural support. Carrier 274 can include an interface layer, double-sided tape, and openings configured to receive composite substrate or reconstituted wafer 260 and interconnect structure 272. Carrier 274 optionally provides additional support for subsequent processing steps of the semiconductor device shown in FIGS. 7g-7j. Alternatively, the subsequent processing steps for the semiconductor device are performed without carrier 274, and the additional support required for subsequent processing is provided by other components, such as encapsulant 254.

FIG. 7g further shows surface 278 of encapsulant 254 opposite interconnect structure 272 undergoes a grinding operation with grinder 280 to planarize the surface and reduce a thickness of the encapsulant. Optionally, the grinding operation also removes a portion of semiconductor die 124. A chemical etch or CMP process can also be used to remove mechanical damage resulting from the grinding operation and planarize encapsulant 254 and semiconductor die 124.

FIG. 7h shows a reconstituted wafer 282 including semiconductor die 124, encapsulant 254, build-up interconnect structure 272, and carrier 274. A back surface of semiconductor die 124, e.g., back surface 138 or a back surface exposed by the grinding operation of FIG. 7g, is partially exposed from encapsulant 254 and coplanar with surface 284 of encapsulant 254 opposite interconnect structure 272.

FIG. 7i shows a supporting layer 288 formed over an entirety of reconstituted wafer 282, including over surface 284 of encapsulant 254 and a back surface of semiconductor die 124 opposite interconnect structure 272. Supporting layer 288 is a fiber enhanced polymer matrix composite material or other suitable material including one or more layers of phenolic cotton paper, epoxy, resin, woven glass, matte glass, carbon fibers, polyester, and other reinforcement fibers or fabrics arranged, e.g., in cross or short-cut formats. Supporting layer 288 includes a core layer and is formed as a pre-prepared composite sheet, which in one embodiment includes a thickness in a range of about 20-80 µm. Alternatively, supporting layer 288 is also applied over reconstituted wafer 282 as a sheet, tape, or paste. Supporting layer 288 is selected to have a thickness, CTE, mechanical strength, thermal properties, and insulation properties that provide both warpage control and enhance package strength. Adjusting the various attributes of supporting layer 288 allows for flexibility in protecting a back surface of semiconductor die 124 and in adjusting an effective CTE for the fo-WLCSP as a whole.

FIG. 7i also shows supporting layer 288 optionally attached to reconstituted wafer 282 with an adhesive or bonding layer 290. Adhesive layer 290 is an epoxy or other adhesive material, and in one embodiment, has a thickness in a range of 5-20 µm, includes a CTE in a range of 10-300 ppm/K, and is laminated to a back surface of semiconductor die 124 and encapsulant 254 on a surface of reconstituted wafer 282 opposite interconnect structure 272. Supporting layer 288 and adhesive layer 290 optionally undergo a curing process. Carrier 274 is removed either before or after the curing process.

FIG. 7j, continuing from FIG. 7i, shows reconstituted wafer 282, interconnect structure 272, carrier 274, supporting layer 288, and adhesive 290 are singulated with saw blade or laser cutting device 292 into individual thin fo-WLCSPs 294. Fo-WLCSPs 294 are singulated before carrier 274 is removed by chemical etching, mechanical peeling, CMP, mechanical grinding, thermal bake, UV light, laser scanning, wet stripping, or other suitable process. Alternatively, carrier 274 is removed after completing the grinding of encapsulant 254 and after the formation of supporting layer 288 but before singulation.

Figure 8:
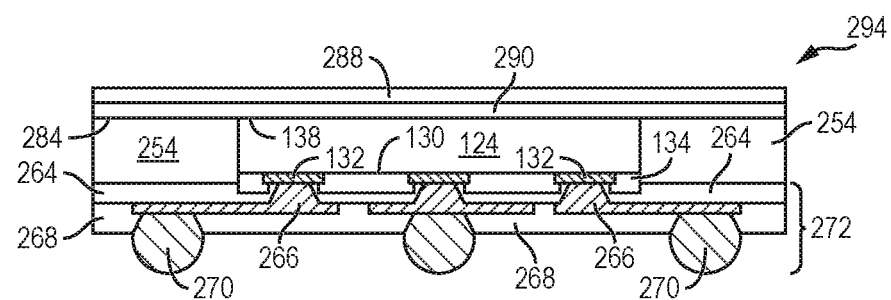
FIG. 8 illustrates an embodiment of a supporting layer formed over a semiconductor die in a thin fo-WLCSP.

FIG. 8 shows an individual fo-WLCSP 294, without carrier 274, that results from the singulation of reconstituted wafer 282 shown in FIG. 7j. Fo-WLCSP 294 is a thin package that provides fan-out horizontal electrical interconnection for semiconductor die 124 and offers a number of advantages over packages known in the prior art. For example, semiconductor die 124 includes a thickness less than or equal to 450 µm and facilitates reduction of an overall package height for use in applications requiring reduced package size. An encapsulant 254 is deposited around semiconductor die 124, and a fan-out build-up interconnect structure 272 is formed over the encapsulant and semiconductor die. Surface 278 of encapsulant 254 opposite interconnect structure 272 undergoes a grinding operation with grinder 280 to planarize the surface and reduce a thickness of the encapsulant, and optionally removes a portion of semiconductor die 124.

Supporting layer 288 is formed over encapsulant 254 and semiconductor die 124 opposite interconnect structure 272 to protect the semiconductor die and help prevent breakage of thinned base substrate material 122. Supporting layer 288 is a fiber enhanced polymer matrix composite material or other suitable material including one or more layers of phenolic cotton paper, epoxy, resin, woven glass, matte glass, carbon fibers, polyester, and other reinforcement fibers or fabrics arranged, e.g., in cross or short-cut formats. Supporting layer 288 includes a core layer and is formed as a pre-prepared composite sheet, which in one embodiment includes a thickness in a range of about 20-80 µm. Alternatively, supporting layer 288 is also applied over reconstituted wafer 282 as a sheet, tape, or paste. Supporting layer 288 is selected to have a thickness, CTE, mechanical strength, thermal properties, and insulation properties that provide both warpage control and enhance package strength. Adjusting the various attributes of supporting layer 288 allows for flexibility in protecting a back surface of semiconductor die 124 and in adjusting an effective CTE for the fo-WLCSP as a whole. An adhesive layer 290 is optionally attached between supporting layer 288 and reconstituted wafer 282. Adhesive layer 290 is an epoxy or other adhesive material, and in one embodiment, has a thickness in a range of 5-20 µm, a CTE in a range of 10-300 ppm/K, and is laminated to a back surface of semiconductor die 124 and encapsulant 254 on a surface of reconstituted wafer 282 opposite interconnect structure 272.

Figure 9:
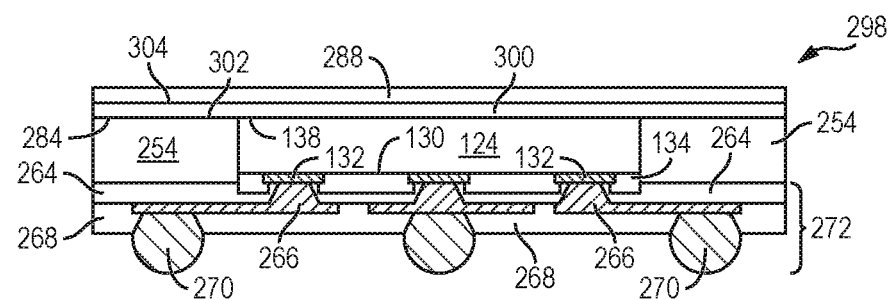
FIG. 9 illustrates another embodiment of a supporting layer formed over a semiconductor die in a thin fo-WLCSP.

FIG. 9 shows an individual fo-WLCSP 298, similar to fo-WLCSP 294 in FIG. 8. Fo-WLCSP 298 differs from fo-WLCSP 294 by the inclusion of adhesive layer 300 instead of adhesive layer 290. Adhesive layer 300 is an epoxy or other bonding or adhesive layer, film, or paste, with or without filler, and in one embodiment, has a thickness in a range of 10-50 µm and shrinks between approximately 1-30% during curing of the adhesive layer. Adhesive layer 300 is disposed over semiconductor die 124 and surface 284 of encapsulant 254 such that a first surface 302 of the adhesive layer contacts the semiconductor die and encapsulant. Supporting layer 288 is formed over adhesive layer 300 and contacts a second surface 304 of the adhesive layer opposite the first surface 302 such that the adhesive layer is disposed between, and attached to, supporting layer 288, as well as the adhesive and semiconductor die. As such, adhesive layer 300 functions as an adhesive at both first surface 302 and second surface 304 to bond the fiber enhanced polymer matrix composite sheet of supporting layer 288 with composite substrate 260. Adhesive layer 300 also functions as a warpage balance layer and is selected to balance warpage of fo-WLCSP 298 as a whole.

Figure 10E:
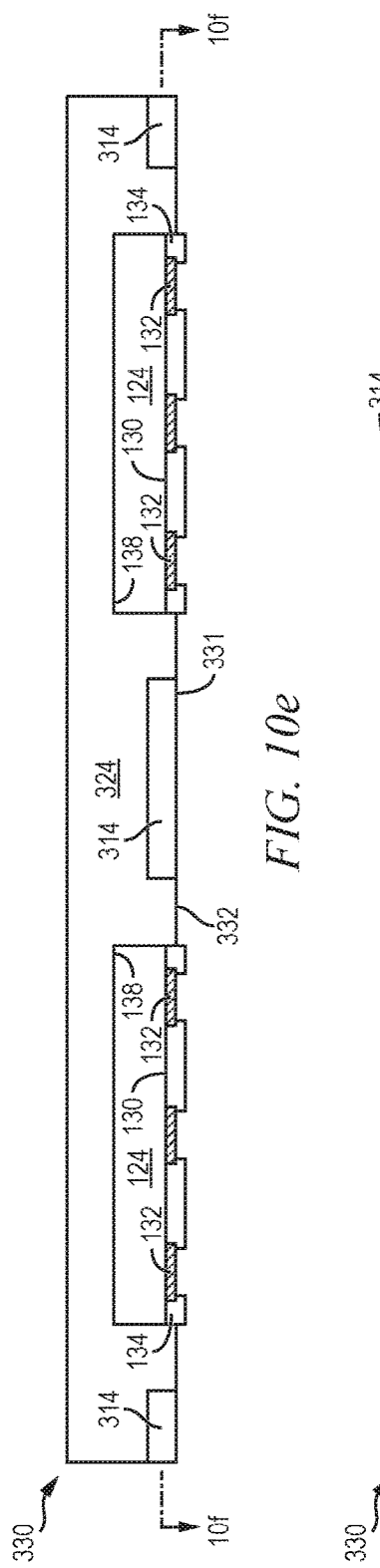

FIGS. 10a-10k illustrate, in relation to FIGS. 1 and 2a-2c, a process of forming a supporting layer over a semiconductor die in a thin fo-WLCSP. FIG. 10a shows a cross-sectional view of a portion of a carrier or temporary substrate 310 containing sacrificial base material such as silicon, polymer, beryllium oxide, glass, or other suitable low-cost, rigid material for structural support. An interface layer or double-sided tape 312 is formed over carrier 310 as a temporary adhesive bonding film, etch-stop layer, or thermal release layer.

FIG. 10a also shows a supporting layer 314 formed over interface layer 312. Supporting layer 314 is a fiber enhanced polymer matrix composite material or other suitable material including one or more layers of phenolic cotton paper, epoxy, resin, woven glass, matte glass, carbon fibers, polyester, and other reinforcement fibers or fabrics arranged, e.g., in cross or short-cut formats. Supporting layer 314 is formed as a pre-prepared fiber enhanced composite sheet that includes punched openings or cavities 315, and in one embodiment supporting layer 314 has a thickness in a range of about 20-80 µm. Openings 315 are formed completely through supporting layer 314 and extend from a first surface of the supporting layer to a second surface of the supporting layer opposite the first surface. Openings 315 are square, rectangular, circular, oval, polygon, or any other shape. A size of openings 315 provides for a width of supporting layer 314 disposed between the openings. When supporting layer 314 is mounted or laminated to interface layer 312 over carrier 310, a portion of the interface layer is exposed through openings 315 to provide a space for subsequently mounting semiconductor die. The width of supporting layer 314 between openings 315 is such that subsequently formed fo-WLCSPs include a width of supporting material that extends from an outer edge of the fo-WLCSP to openings 315 and strengthens the package. In one embodiment, the width of supporting material extending from the outer edge of the fo-WLCSP to an opening 315 is at least 50 µm. Supporting layer 314 is selected to have a thickness, CTE, mechanical strength, thermal properties, and insulation properties that provide both warpage control and enhance package strength. Adjusting the various attributes of supporting layer 314 allows for flexibility in adjusting an effective CTE for the fo-WLCSP as a whole.

In FIG. 10b, semiconductor die 124 from FIG. 3f are mounted to interface layer 312 and over carrier 310 within openings 315 using, for example, a pick and place operation with active surface 130 oriented toward the carrier. Semiconductor die 124 are mounted within openings 315 because supporting layer 314 is mounted to carrier 310 and interface layer 312 before the semiconductor die are mounted to the carrier. Semiconductor die 124 are pressed into interface layer 312 such that a portion of insulating layer 134 or semiconductor die 124 is disposed within, and surrounded by, the interface layer. An area or footprint of openings 315 is larger than an area or footprint of semiconductor die 124 such that a space or gap exists between the semiconductor die and supporting layer 314.

In FIG. 10c, carrier 310, semiconductor die 124, and supporting layer 314 are placed in chase mold 316 having a plurality of inlets 318 and 320, and a cavity 322. Carrier 310 is placed into chase mold 316 so that semiconductor die 124 and supporting layer 314 are disposed within cavity 322. A volume of encapsulant or molding compound 324 is injected from dispenser 326 under an elevated temperature and pressure through inlet 318 into cavity 322, over and around semiconductor die 124, and over carrier 310. Inlet 320 can be an exhaust port with optional vacuum assist 328 for excess encapsulant 324. Encapsulant 324 can be a polymer composite material, such as epoxy resin with filler, epoxy acrylate with filler, or polymer with proper filler. Encapsulant 324 is non-conductive, provides physical support, and environmentally protects semiconductor die 124 from external elements and contaminants. A volume of encapsulant 324 is measured according to the space requirements of cavity 322 less the area occupied by semiconductor die 124 and supporting layer 314. Encapsulant 324 is evenly dispersed and uniformly distributed under an elevated temperature within cavity 322, around semiconductor die 124, around supporting layer 314, and in the space or gap that exists between the semiconductor die and the supporting layer.

FIG. 10d shows composite substrate or reconstituted wafer 330 covered by encapsulant 324. Encapsulant 324 can be formed as a portion of composite substrate 330 in a chase mold as depicted in FIG. 10c, and as recited in the supporting text. Alternatively, encapsulant 324 can be formed as a portion of composite substrate 330 using a paste printing, compressive molding, transfer molding, liquid encapsulant molding, vacuum lamination, or other suitable applicator. Encapsulant 324 is formed over back surface 138 of semiconductor die 124, and can be thinned in a subsequent backgrinding step. Encapsulant 324 can also be deposited such that the encapsulant is coplanar with back surface 138 of semiconductor die 124 and does not cover the back surface. In either case, encapsulant 324 facilitates the subsequent formation of a fan-out build-up interconnect structure over encapsulant 324 and outside a footprint of semiconductor die 124.

In FIG. 10e, carrier 310 and interface layer 312 are removed from composite substrate 330 by chemical etching, mechanical peeling, CMP, mechanical grinding, thermal bake, UV light, laser scanning, or wet stripping to facilitate the subsequent formation of an interconnect structure over active surface 130 of semiconductor die 124, over supporting layer 314, and over encapsulant 324. With the removal of carrier 310 and interface layer 312, both a surface 331 of supporting layer 314 and a surface 332 of encapsulant 324 are exposed as a portion of an outer surface of composite substrate 330. In one embodiment, surface 331 of supporting layer 314 and a surface 332 of encapsulant 324 are coplanar with respect to each other, and are also coplanar with semiconductor die 124 or insulating layer 134.

Figure 10F:
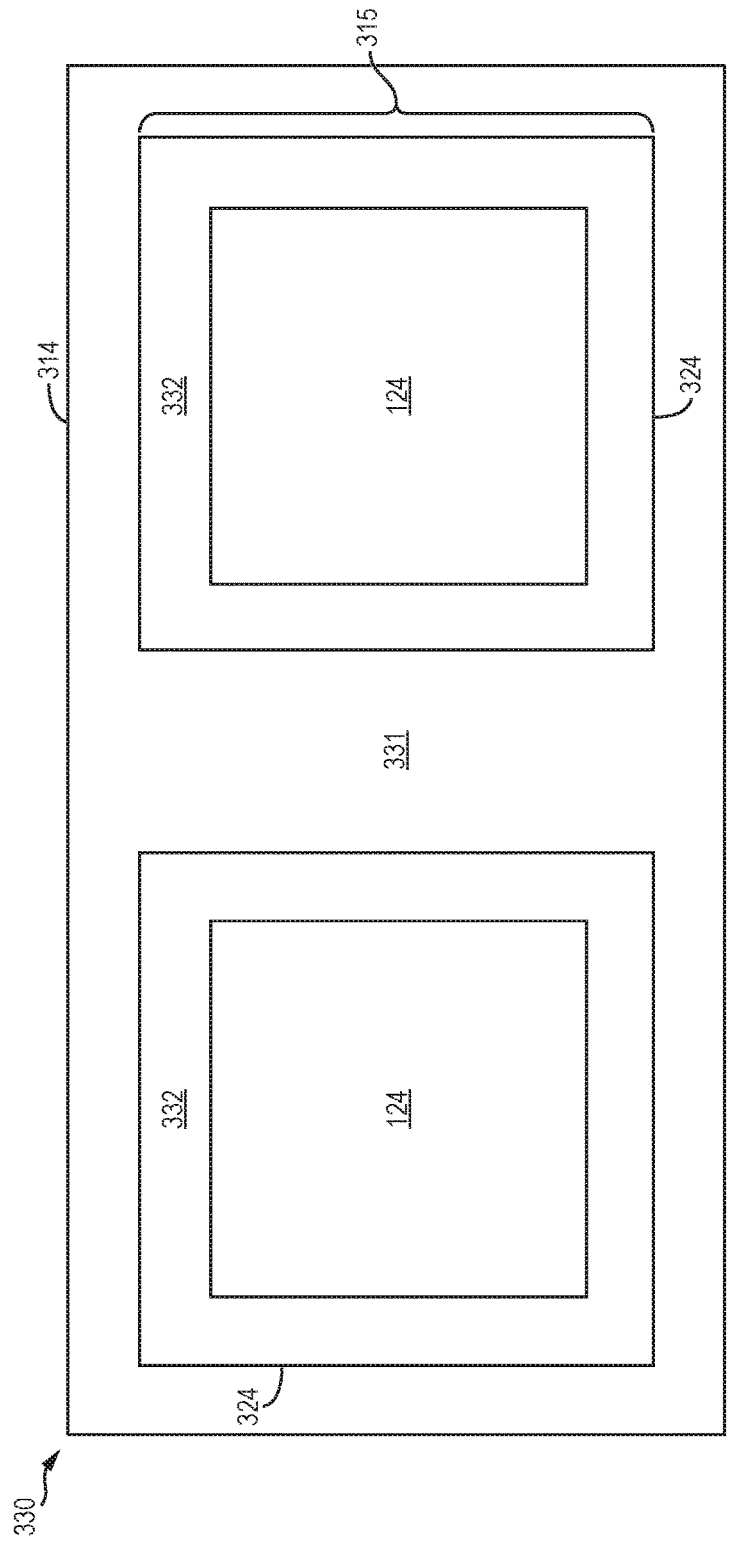

FIG. 10f shows a plan view of composite substrate 330 after the removal of carrier 310 and interface layer 312, which was previously shown in cross-sectional view in FIG. 10e. FIG. 10f shows semiconductor die 124 are disposed within openings 315 of supporting layer 314. Both a surface 331 of supporting layer 314 and a surface 332 of encapsulant 324 are exposed as a portion of an outer surface of composite substrate 330. Encapsulant 324 is disposed in the space or gap that exists between semiconductor die 124 and supporting layer 314.

FIG. 10g shows a first portion of a fan-out build-up interconnect structure or RDL is formed by the deposition and patterning of insulating or passivation layer 334. Insulating layer 334 is conformally applied to, and has a first surface that follows the contours of, surface 331 of supporting layer 314, first surface 332 of encapsulant 324, insulating layer 134, semiconductor die 124, and conductive layer 132. Insulating layer 334 has a second planar surface opposite the first surface. Insulating layer 334 contains one or more layers of SiO2, Si3N4, SiON, Ta2O5, Al2O3, or other material having similar insulating and structural properties. Insulating layer 334 is deposited using PVD, CVD, printing, spin coating, spray coating, sintering, thermal oxidation, or other suitable process. A portion of insulating layer 334 is removed by an exposure or development process, LDA, etching, or other suitable process to form openings over conductive layer 132. The openings expose conductive layer 132 of semiconductor die 124 for subsequent electrical interconnect.

An electrically conductive layer 336 is patterned and deposited over insulating layer 334, over semiconductor die 124, and disposed within the openings in insulating layer 334 to fill the openings and contact conductive layer 132. Conductive layer 336 is one or more layers, including seed layers, that include Al, Cu, Sn, Ni, Au, Ag, Ti/Cu, TiW/Cu, Ti/NiV/Cu, TiW/NiV/Cu, or other suitable electrically conductive material. The deposition of conductive layer 336 uses PVD, CVD, electrolytic plating, electroless plating, or other suitable process. In one embodiment, the deposition of conductive layer 336 includes selective plating with a seed layer and lithography. Conductive layer 336 operates as an RDL to fan-out and extend electrical connection from semiconductor die 124 to points external to semiconductor die 124.

In FIG. 10h, an insulating or passivation layer 338 is conformally applied to, and follows the contours of, insulating layer 334 and conductive layer 336. Insulating layer 338 contains one or more layers of SiO2, Si3N4, SiON, Ta2O5, Al2O3, or other material having similar insulating and structural properties. Insulating layer 338 is deposited using PVD, CVD, printing, spin coating, spray coating, sintering, thermal oxidation, or other suitable process. A portion of insulating layer 338 is removed by an exposure or development process, LDA, etching, or other suitable process to form openings in the insulating layer. The openings expose portions of conductive layer 336 for subsequent electrical interconnection.

FIG. 10h also shows an electrically conductive bump material is deposited over conductive layer 336 and within the openings in insulating layer 338 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 336 using a suitable attachment or bonding process. In one embodiment, the bump material is reflowed by heating the material above its melting point to form spherical balls or bumps 340. In some applications, bumps 340 are reflowed a second time to improve electrical contact to conductive layer 336. In one embodiment, bumps 340 are formed over a UBM having a wetting layer, barrier layer, and adhesive layer. The bumps can also be compression bonded to conductive layer 336. Bumps 340 represent one type of interconnect structure that can be formed over conductive layer 336. The interconnect structure can also use bond wires, conductive paste, stud bump, micro bump, or other electrical interconnect.

Taken together, insulating layers 334 and 338, as well as conductive layer 336 and conductive bumps 340 form interconnect structure 342. The number of insulating and conductive layers included within interconnect structure 342 depends on, and varies with, the complexity of the circuit routing design. Accordingly, interconnect structure 342 can include any number of insulating and conductive layers to facilitate electrical interconnect with respect to semiconductor die 124.

Figure 10I:
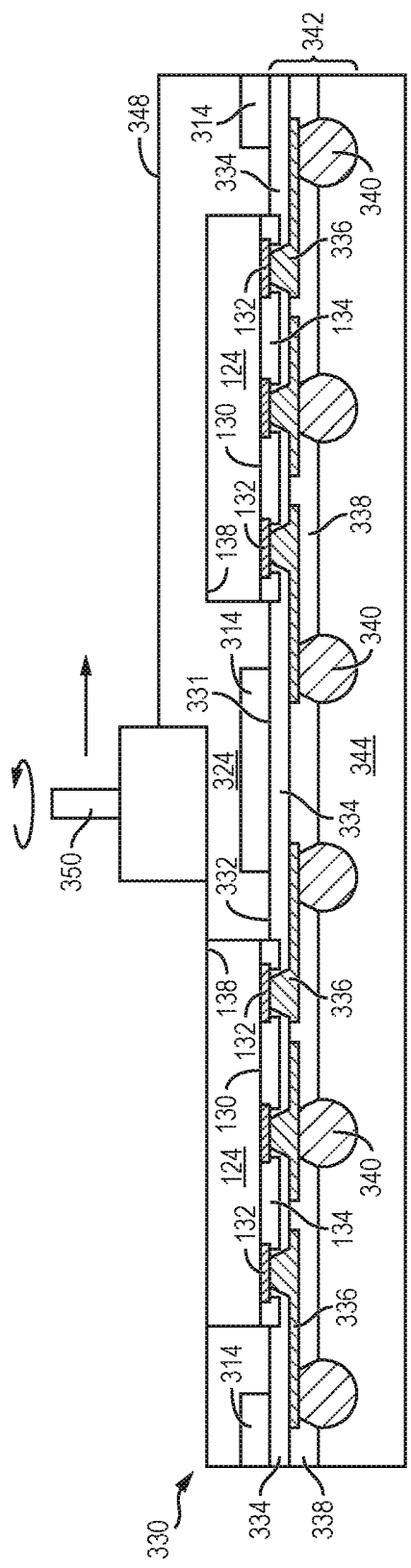

In FIG. 10i, an optional carrier or temporary substrate 344 is disposed over interconnect structure 342. Carrier 344 includes a backgrinding tape, supporting tape, and other carriers containing sacrificial base material such as silicon, polymer, beryllium oxide, glass, or other suitable low-cost, rigid material for structural support. Carrier 344 can include an interface layer, double-sided tape, and openings configured to receive composite substrate or reconstituted wafer 330 and interconnect structure 342. Carrier 344 optionally provides additional support for subsequent processing steps of the semiconductor device shown in FIGS. 10i-10k. Alternatively, the subsequent processing steps for the semiconductor device are performed without carrier 344, and the additional support required for subsequent processing is provided by other components, such as encapsulant 324.

FIG. 10i further shows second surface 348 of encapsulant 324 opposite first surface 332 and interconnect structure 342 undergoes a grinding operation with grinder 350 to planarize the surface and reduce a thickness of the encapsulant. Optionally, the grinding operation also removes a portion of semiconductor die 124. A chemical etch or CMP process can also be used to remove mechanical damage resulting from the grinding operation and planarize encapsulant 324 and semiconductor die 124.

Figure 10J:
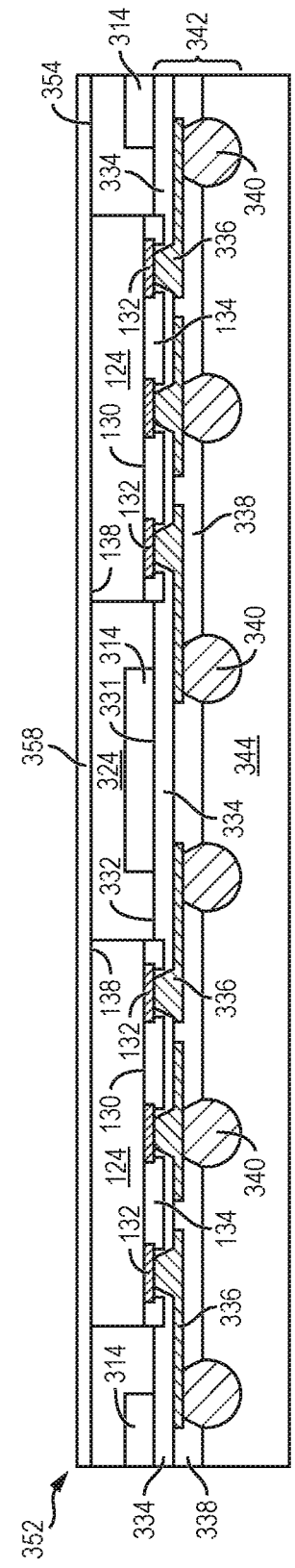

FIG. 10j shows a reconstituted wafer 352 including semiconductor die 124, supporting layer 314, encapsulant 324, build-up interconnect structure 342, and carrier 344. A back surface of semiconductor die 124, e.g., back surface 138 or a back surface exposed by the grinding operation of FIG. 10i, is partially exposed from encapsulant 324 and coplanar with surface 354 of encapsulant 324 opposite interconnect structure 342.

A warpage balance layer 358 is attached to reconstituted wafer 352 and contacts surface 354 of encapsulant 324 and a back surface of semiconductor die 124 using printing, spin coating, spray coating, screen printing, lamination, paste printing, compressive molding, transfer molding, liquid encapsulant molding, vacuum lamination, or other suitable applicator. Warpage balance layer 358 can be one or more layers of photosensitive polymer dielectric film with or without fillers, non-photosensitive polymer dielectric film, epoxy, epoxy resin, polymeric materials, polymer composite material such as epoxy resin with filler, epoxy acrylate with filler, or polymer with proper filler, thermoset plastic laminate, or other material having similar insulating and structural properties. In one embodiment, warpage balance layer 358 is a sheet that includes a bonding or adhesive function and is laminated to reconstituted wafer 352. Warpage balance layer 358 is non-conductive, provides physical support, controls overall package warpage, and environmentally protects semiconductor die 124 from external elements and contaminants. Warpage balance layer 358 provides structural support and balances stress on the completed fo-WLCSP. Warpage characteristics of warpage balance layer 358, including thickness of the warpage balance layer and material properties, are adjusted according to overall package configuration and design. In one embodiment, warpage balance layer 358 has a thickness in a range of 10-50 μm and includes a CTE in a range of 10-300 ppm/K. Warpage balance layer 358 undergoes a curing process. Carrier 344 is removed either before or after the curing process.

Figure 10K:
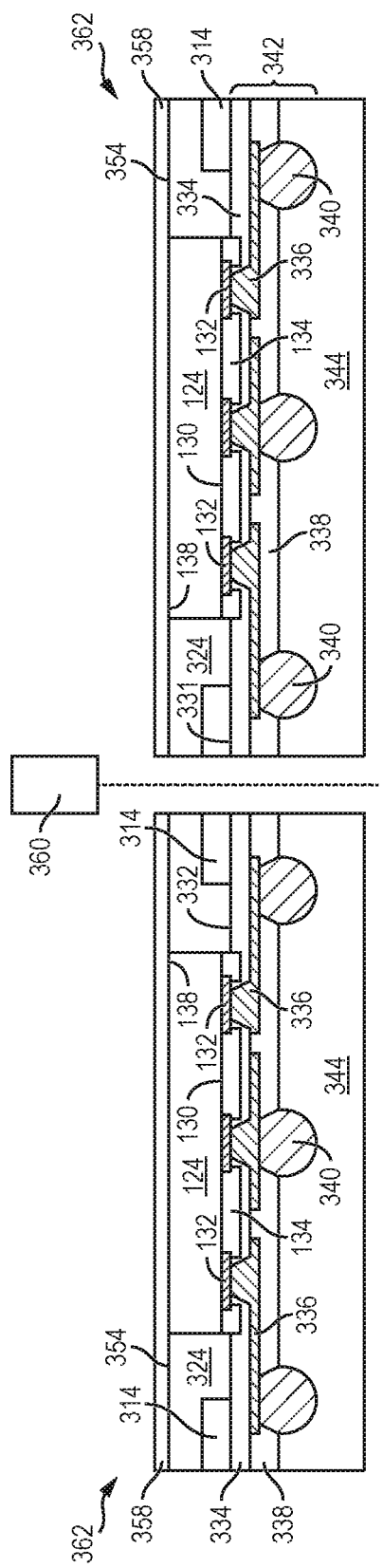

FIG. 10k, continuing from FIG. 10j, shows reconstituted wafer 352 and warpage balance layer 358 are singulated with saw blade or laser cutting device 360 into individual thin fo-WLCSPs 362. Fo-WLCSPs 362 are singulated before carrier 344 is removed by chemical etching, mechanical peeling, CMP, mechanical grinding, thermal bake, UV light, laser scanning, wet stripping, or other suitable process. Alternatively, carrier 344 is removed after completing the grinding of encapsulant 324 but before singulation.

Figure 11:
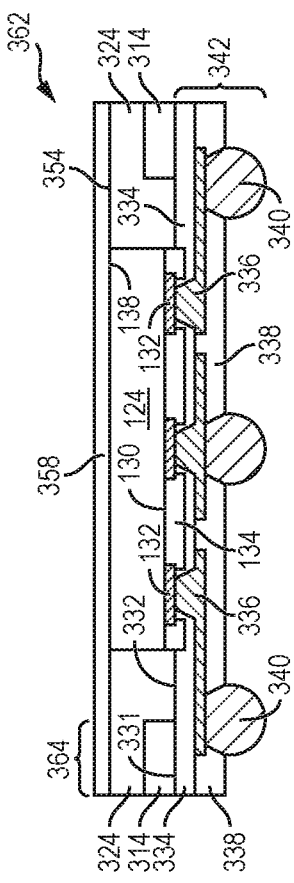
FIG. 11 illustrates another embodiment of a supporting layer formed over a semiconductor die in a thin fo-WLCSP.

FIG. 11 shows an individual fo-WLCSP 362, without carrier 344, that results from the singulation of reconstituted wafer 352 shown in FIG. 10k. Fo-WLCSP 362 is a thin package that provides fan-out horizontal electrical interconnection for semiconductor die 124 and offers a number of advantages over packages known in the prior art. For example, semiconductor die 124 includes a thickness less than or equal to 450 μm and facilitates reduction of an overall package height for use in applications requiring reduced package size. Supporting layer 314 is a fiber enhanced polymer matrix composite material that includes punched openings or cavities 315, and in one embodiment has a thickness in a range of about 20-80 μm. Openings 315 provide a gap around semiconductor die 124 and create a width 364 of supporting layer 314 between openings 315 and an outer edge of fo-WLCSP 362 to provide warpage control and enhance the strength of the fo-WLCSP. In one embodiment, supporting material layer 314 includes a width 364 of at least 50 μm that extends into fo-WLCSP 362. An encapsulant 324 is deposited around semiconductor die 124, and a fan-out build-up interconnect structure is formed over the encapsulant and semiconductor die. Second surface 348 of encapsulant 324 opposite interconnect structure 342 undergoes a grinding operation with grinder 350 to planarize the surface and reduce a thickness of the encapsulant, and optionally removes a portion of semiconductor die 124. A warpage balance layer 358 is attached to second surface 354 of encapsulant 324 and a back surface of semiconductor die 124. In one embodiment, warpage balance layer 358 is a sheet having a thickness in a range of 10-50 μm that includes a bonding or adhesive function. Warpage balance layer 358 provides structural support, controls overall package warpage, and balances stress on the completed fo-WLCSP.

Figure 12A:
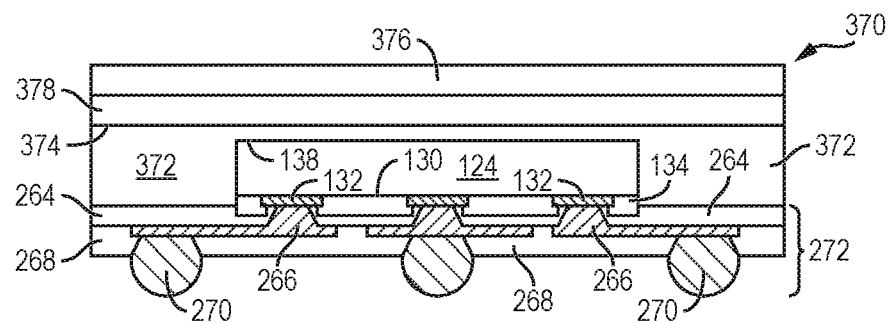
FIGS. 12a and 12b illustrate embodiments of a supporting layer formed over a semiconductor die in a thin fo-WLCSP.

FIG. 12a shows an individual fo-WLCSP 370, similar to fo-WLCSP 294 in FIG. 8. Fo-WLCSP 370 differs from fo-WLCSP 294 by the inclusion of encapsulant or molding compound 372 that is disposed over back surface 138 of semiconductor die 124 within fo-WLCSP 370. Fo-WLCSP 370 is a thin package that provides fan-out horizontal electrical interconnection for semiconductor die 124 and offers a number of advantages over packages known in the prior art. For example, semiconductor die 124 includes a thickness less than or equal to 450 μm and facilitates reduction of an overall package height for use in applications requiring reduced package size. Encapsulant 372, similar to encapsulant 254 shown in FIG. 7c through FIG. 8, is over-molded and deposited around semiconductor die 124. A fan-out build-up interconnect structure 272 is formed over encapsulant 372 and semiconductor die 124, as shown, for example, in FIGS. 7a-7j. A top surface of encapsulant 372 opposite interconnect structure 272, similar to surface 278 of encapsulant 254, undergoes a grinding operation with a grinder to planarize the surface and reduce a thickness of the encapsulant, as shown for example in FIG. 7g. However, grinding of encapsulant 372 during formation of fo-WLCSP 370 does not remove a portion of semiconductor die 124. Instead, after removing a portion of encapsulant 372, a top surface 374 of the encapsulant remains disposed over semiconductor die 124 such that encapsulant 372 is conformally applied to back surface 138 of the semiconductor die and the back surface is not exposed with respect to the encapsulant.

A supporting layer 376, similar to supporting layer 288 from FIG. 8, is formed over semiconductor die 124 and surface 374 of encapsulant 372 opposite interconnect structure 272. Supporting layer 376 protects semiconductor die 124 and helps prevent breakage of thinned base substrate material 122. Supporting layer 376 is a fiber enhanced polymer matrix composite material or other suitable material including one or more layers of phenolic cotton paper, epoxy, resin, woven glass, matte glass, carbon fibers, polyester, and other reinforcement fibers or fabrics arranged, e.g., in cross or short-cut formats. Supporting layer 376 includes a core layer and is formed as a pre-prepared composite sheet, which in one embodiment includes a thickness in a range of about 20-80 μm. Alternatively, supporting layer 376 is also applied as a sheet, tape, or paste. Supporting layer 376 is selected to have a thickness, CTE, mechanical strength, thermal properties, and insulation properties that provide both warpage control and enhance package strength. Adjusting the various attributes of supporting layer 376 allows for flexibility in protecting semiconductor die 124 and in adjusting an effective CTE for fo-WLCSP 370 as a whole. An adhesive or bonding layer 378 is optionally attached between supporting layer 376 and encapsulant 372. Adhesive layer 378 is an epoxy or other adhesive material, and in one embodiment, has a thickness in a range of 0-20 μm. Adhesive layer 378, when present, is formed over semiconductor die 124 and contacts surface 374 of encapsulant 372 opposite interconnect structure 272.

Figure 12B:
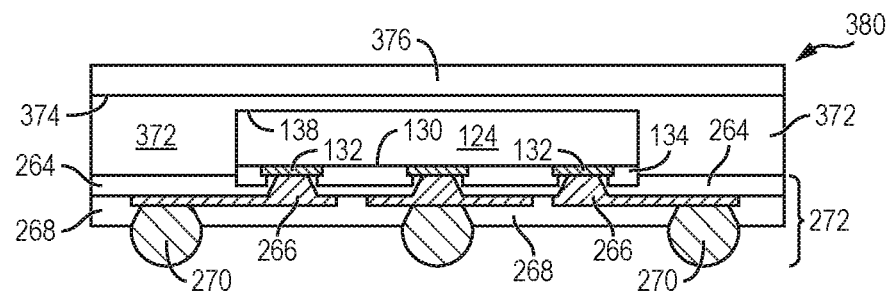

FIG. 12b shows an individual fo-WLCSP 380, similar to fo-WLCSP 370 in FIG. 12a. Fo-WLCSP 380 differs from fo-WLCSP 370 by forming supporting layer 376 directly contacting semiconductor die 124 and surface 374 of encapsulant 372 opposite interconnect structure 272 without the inclusion of adhesive layer 378.

Figure 13A:
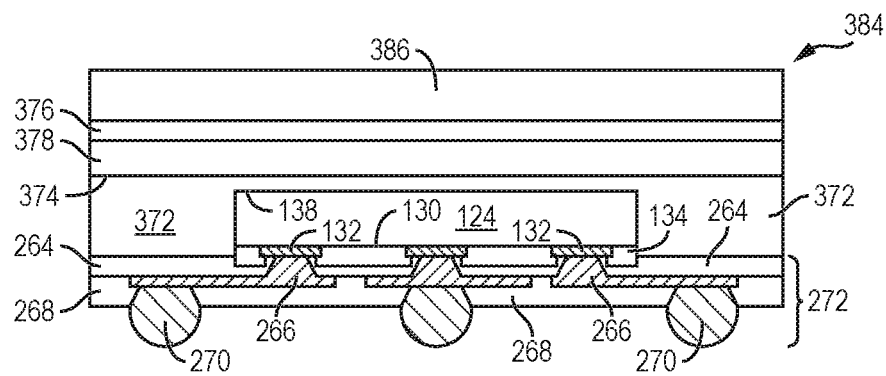
FIGS. 13a and 13b illustrate embodiments of a supporting layer formed over a semiconductor die in a thin fo-WLCSP.

FIG. 13a shows an individual fo-WLCSP 384, similar to fo-WLCSP 370 in FIG. 12a. Fo-WLCSP 384 differs from fo-WLCSP 370 by the inclusion of marking layer or backside marking layer 386 disposed over and directly contacting supporting layer 376 opposite encapsulant 372 to form an outer surface of fo-WLCSP 384. Marking layer 386 is one or more layers of an insulating material, epoxy, epoxy with silica, epoxy with carbon filler, or other suitable material and is applied over supporting layer 376 as a sheet, tape, or paste using screen printing, spin coating, spray coating, lamination, or other suitable process. Marking layer 386 is black, silver, green, or other suitable color. In one embodiment, marking layer 386 is applied at a wafer or panel level over supporting layer 376 before singulation. Marking layer 386 protects semiconductor die 124 and enhances strength of fo-WLCSP 384. Marking layer 386 further provides a surface in which identification marks are made to communicate product information and enable traceability of a product. In one embodiment, laser markings are made in marking layer 386 to designate a manufacturer's name, lot number, company logo, manufacturing history, pin orientation, or other desired information.

Figure 13B:
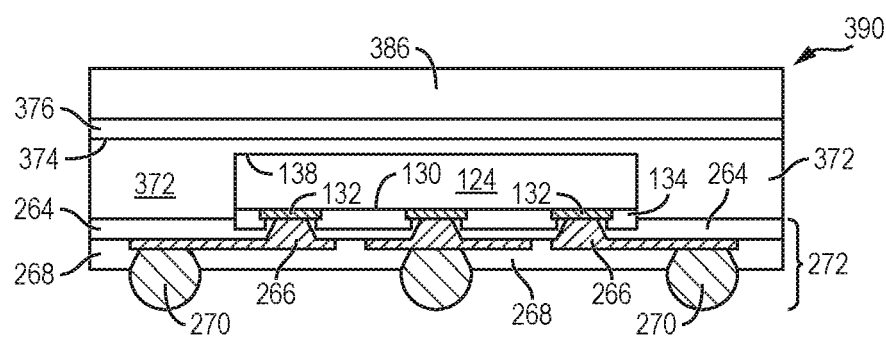

FIG. 13b shows an individual fo-WLCSP 390, similar to fo-WLCSP 384 in FIG. 13a. Fo-WLCSP 390 differs from fo-WLCSP 384 by forming marking layer 386 over encapsulant 372, over semiconductor die 124, and directly contacting a surface of supporting layer 376 opposite interconnect structure 272 without the inclusion of adhesive layer 378.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a carrier;
    disposing a first supporting layer over the carrier with an opening in the first supporting layer;
    disposing a semiconductor die over the carrier within the opening of the first supporting layer, wherein a width of the opening is greater than a width of the semiconductor die leaving a gap between a side surface of the semiconductor die and a side surface of the first supporting layer, and wherein a height of the semiconductor die is greater than a height of the first supporting layer;

depositing an encapsulant over the semiconductor die and in the gap between the semiconductor die and first supporting layer to contact the side surface of the semiconductor die and the side surface of the first supporting layer; and removing the carrier after depositing the encapsulant.

2. The method of claim 1, further including:

disposing the semiconductor die over the carrier with an active surface of the semiconductor die oriented toward the carrier; and forming an interconnect structure over the active surface of the semiconductor die and a first surface of the encapsulant after removing the carrier.

3. The method of claim 2, further including forming a second supporting layer over a second surface of the encapsulant opposite the first surface of the encapsulant.

4. The method of claim 1, wherein the first supporting layer includes a fiber enhanced polymer matrix composite material.

5. The method of claim 1, further including removing a portion of the encapsulant.

6. The method of claim 1, wherein removing the carrier exposes the first supporting layer and semiconductor die.

7. The method of claim 1, further including disposing the semiconductor die over the carrier with an active surface of the semiconductor die oriented toward the carrier.

8. A method of making a semiconductor device, comprising:

providing a semiconductor die;

disposing a first supporting layer in a peripheral region around the semiconductor die to leave a gap between a side surface of the semiconductor die and a side surface of the first supporting layer, wherein a height of the first supporting layer is less than a height of the semiconductor die; and depositing an encapsulant over the semiconductor die and in the gap between the semiconductor die and first supporting layer to contact the side surface of the semiconductor die and the side surface of the first supporting layer.

9. The method of claim 8, further including forming an interconnect structure over the semiconductor die and a first surface of the encapsulant.

10. The method of claim 9, further including forming a second supporting layer over a second surface of the encapsulant opposite the first surface of the encapsulant.

11. The method of claim 10, wherein the second supporting layer includes a polymer dielectric film.

12. The method of claim 8, wherein the first supporting layer includes a fiber enhanced polymer matrix composite material.

13. The method of claim 8, further including removing a portion of the encapsulant.

14. A semiconductor device, comprising:

a first supporting layer;

a semiconductor die disposed within an opening of the first supporting layer, wherein a width of the opening is greater than a width of the semiconductor die with a gap between a side surface of the semiconductor die and a side surface of the first supporting layer, and wherein a height of the first supporting layer is less than a height of the semiconductor die; and an encapsulant deposited over the semiconductor die and in the gap between the semiconductor die and first supporting layer to contact the side surface of the semiconductor die and the side surface of the first supporting layer.

15. The semiconductor device of claim 14, further including an interconnect structure formed over the semiconductor die and a first surface of the encapsulant.

16. The semiconductor device of claim 15, further including a second supporting layer formed over a second surface of the encapsulant opposite the first surface of the encapsulant.

17. The semiconductor device of claim 16, wherein the second supporting layer includes a polymer dielectric film.

18. The semiconductor device of claim 15, wherein the first supporting layer includes a fiber enhanced polymer matrix composite material.

19. A semiconductor device comprising:

a semiconductor die;

a first supporting layer disposed in a peripheral region around the semiconductor die to leave a gap between a side surface of the semiconductor die and a side surface of the first supporting layer, wherein a height of the first supporting layer is less than a height of the semiconductor die; and an encapsulant deposited over the semiconductor die and in the gap between the semiconductor die and first supporting layer to contact the side surface of the semiconductor die and the side surface of the first supporting layer.

20. The semiconductor device of claim 19, further including an interconnect structure formed over the semiconductor die and a first surface of the encapsulant.

21. The semiconductor device of claim 20, further including a second supporting layer formed over a second surface of the encapsulant opposite the first surface of the encapsulant.

22. The semiconductor device of claim 21, wherein the second supporting layer includes a polymer dielectric film.

23. The semiconductor device of claim 19, wherein the first supporting layer includes a fiber enhanced polymer matrix composite material.

* * * * *